(12) United States Patent
    Asenath-Smith et al.

(10) Patent No.: US 11,719,619 B2
(45) Date of Patent: Aug. 8, 2023

(54) SYSTEM AND METHOD FOR TESTING ADHESION OF BRITTLE MATERIALS

(71) Applicant: United States of America as Represented by The Secretary of The Army, Alexandria, VA (US)

(72) Inventors: Emily Asenath-Smith, Norwich, VT (US); Garrett R. Hoch, Lebanon, NH (US); Christopher J Donnelly, Piermont, NH (US); Jordan M. Hodge, Bradford, VT (US)

(73) Assignee: UNITED STATES OF AMERICA AS REPRESENTED BY THE SECRETARY OF THE ARMY, Alexandria, VA (US)

( * ) Notice: Subject to any disclaimer, the term of this patent is extended or adjusted under 35 U.S.C. 154(b) by 55 days.

(21) Appl. No.: 17/169,203

(22) Filed: Feb. 5, 2021

(65) Prior Publication Data

US 2021/0270724 A1    Sep. 2, 2021

Related U.S. Application Data

(63) Continuation-in-part of application No. 16/802,490, filed on Feb. 26, 2020, now Pat. No. 11,421,340.

(51) Int. Cl.
    *C30B 15/14*    (2006.01)
    *G01N 19/04*    (2006.01)
    (Continued)

(52) U.S. Cl.
    CPC .......... *G01N 19/04* (2013.01); *C30B 15/14* (2013.01); *C30B 29/68* (2013.01); *C30B 15/20* (2013.01)

(58) Field of Classification Search
    CPC ........ G01N 19/04; C30B 29/68; C30B 28/10; C30B 15/14; C30B 15/20
    See application file for complete search history.

(56) References Cited

U.S. PATENT DOCUMENTS 4,226,834 A * 10/1980 Shudo ................... C30B 15/06
                                                117/922
5,555,747 A *  9/1996 Conlon .................... C02F 1/22
                                                 62/123

(Continued)

OTHER PUBLICATIONS

Libbrecht et al "Measurements of surface attachment kinetics for faceted ice crystal growth" Journal of Crystal Growth vol. 377, 2013 pp. 1-8.*

*Primary Examiner* — Robert M Kunemund
(74) *Attorney, Agent, or Firm* — Brian C. Jones

(57) ABSTRACT

One embodiment is directed to a method of testing a polycrystalline laminate formed on a substrate surface of a substrate which is mounted to a sample holder. The substrate surface includes a substrate length edge having a substrate length and a substrate width edge having a substrate width. The polycrystalline laminate has a notch extending beyond the substrate width edge of the substrate surface. The method comprises at least one of: for tensile cleavage testing, applying a tensile load on the notch of the polycrystalline laminate in a direction generally perpendicular to the substrate surface and away from the substrate surface; and for shear sliding testing, applying a shear load on the end of the polycrystalline laminate in a length direction generally parallel to the substrate length edge of the substrate surface. A notch edge formation piece and a notch end formation piece may be used to form the laminate.

20 Claims, 23 Drawing Sheets

(51) Int. Cl.
*C30B 29/68* (2006.01)
*C30B 15/20* (2006.01)

(56) References Cited

U.S. PATENT DOCUMENTS

| | | | | |
|---|---|---|---|---|
| 6,090,198 A | * | 7/2000 | Aydelott | ............... C30B 15/14 117/20 |
| 2013/0112135 A1 | * | 5/2013 | Carlson | ................. C30B 15/06 117/73 |

* cited by examiner

Table 1. Properties of materials used as substrates for ice crystallization

| Material | Thickness | Roughness (R$_a$) | Contact angle ($\theta_{adv}/\theta_{rec}$, degrees) | Thermal Conductivity (W/mK)[d] | Specific Heat (kJ/kg °C)[d] |
|---|---|---|---|---|---|
| Aluminum[a] | 10 mm | 0.29±0.01 µm | 71±2/44±3 | 165 | 0.87 |
| Glass | 1 mm[b] | 0.46±0.03 nm | 28±2/17±2 | 0.96 | 0.84 |
| Teflon | 25 µm[c] | 1.29±0.27 µm | 114±2/96±2 | 0.25 | 1.2 |

[a]Polished to P4000
[b]Adhered to aluminum coupon with thermally conductive grease
[c]Coated over 10 mm aluminum coupon
[d]Values from The Engineering ToolBox (www.engineeringtoolbox.com)

Fig. 2

SYSTEM AND METHOD FOR TESTING ADHESION OF BRITTLE MATERIALS

This application is a continuation in part of application Ser. No. 16/802,490 filed on Feb. 26, 2020, now U.S. Pat. No. 11,421,430.

STATEMENT OF GOVERNMENT INTEREST

Under paragraph 1(a) of Executive Order 10096, the conditions under which this invention was made entitle the Government of the United States, as represented by the Secretary of the Army, to an undivided interest therein on any patent granted thereon by the United States. This and related patents are available for licensing to qualified licensees.

BACKGROUND

Field of the Invention

The present invention relates to adhesion testing apparatus and method, and, more particularly but not exclusively, to tensile peel and shear cleavage adhesion testing of adhesion materials including brittle adhesive materials.

Description of the Related Art

This section introduces aspects that may help facilitate a better understanding of the invention. Accordingly, the statements of this section are to be read in this light and are not to be understood as admissions about what is prior art or what is not prior art.

The growth of ice on surfaces is ubiquitous in natural environments. Polycrystalline ice is the form most commonly found in nature, regardless of whether it is formed from the accretion of small supercooled droplets or the slow freezing of large volumes of water. There is limited guidance available about growth of ice on surfaces for adhesion testing and analysis. The growth of large single crystals of ice has been accomplished via many methods from zone refining to melt solidification and various molded methods. A small group of reports have derived inspiration from Czochralski's method, drawing a solid single crystal (of ice) from a liquid melt (of water). See, e.g., A. Higashi, Growth and Perfection of Ice Crystals, Journal of Crystal Growth, 24 (1974) 102-107. Such prior methods do not selectively freeze single crystal versus polycrystalline ice on surfaces with specific control over the microstructures.

ASTM International maintains standards for a wide variety of materials testing and aspects of materials testing. There are many ASTM standards for testing adhesive properties of tapes, coatings, and bonding agents used in composite materials. A short sampling of the standards includes the following: Lap Shear Adhesion of Fiber Reinforced Plastic Bonding (ASTM D5868-01), Pull-Off Adhesion Strength of Coatings on Concrete (ASTM D7324-19), Method for Evaluating Adhesion by Knife (ASTM D6677-18), Peel Adhesion of Pressure-Sensitive Tape (ASTM D3330-04), Test Methods for Rating Adhesion by Tape Test (ASTM D3359-17), and Strength Properties of Adhesives in Cleavage Peel by Tension Loading (ASTM D3807-98). None of these are suitable for testing brittle adhesives such as ice.

SUMMARY

The present invention was developed to address the need for a robust crystallization method for growth of freshwater ice or other polycrystalline materials on surfaces and testing thereof. Research and development has led to a novel vertical draw method and apparatus to crystallize ice directly onto surfaces from a liquid water melt. The research shows that surface crystallization is induced by optimizing the temperature difference between the substrate and liquid water reservoir, and that seeding the substrates is used to obtain consistent polycrystalline columnar microstructures. These results are presented in the context of the thermal, chemical, and physical properties of the substrate surfaces, so as to provide a crystallization approach that is broadly applicable to ice adhesion investigations on a wide range of surfaces. Embodiments of the present invention encompass the use of vertical draw systems and methods for growing ice on surfaces to achieve consistent polycrystalline columnar microstructures.

The present invention advances the science of adhesion testing especially for polycrystalline laminates or the like including ice. Key to the success of this apparatus is the ability to form a polycrystalline laminate with a notch on a substrate. Adhesion testing is conducted by measuring the force required to break the substrate-laminate interface. Adhesion testing on the notched laminate on the substrate can then be performed by tensile cleavage using a tensile load head to lift the notched laminate from the substrate or by shear sliding using a shear load head to slide the notched laminate along the substrate.

The present technique is different from Standard D3807, which is specifically for adhesives relevant to plastics using a sandwich-like geometry (bonded assembly). In that scenario, the overall strength of the adhesive, to bond together two pieces of engineering plastic, is assessed by pulling apart the two pieces of plastic. Standard D3807 cannot be translated to ice adhesion tests, wherein the ice (a brittle material) is the adhesive and must be completely removed from the material of interest (not necessarily plastic). If ice were used in that configuration as the adhesive (i.e., inside a material sandwich), the assembly would undergo cohesive failure in the ice, because ice is largely brittle, introducing great error into the measured force values because the test would not be able to measure the delamination of the ice-substrate interface.

Largely, the existing ASTM standards and their associated apparatuses employ sandwich-like geometries for their tests. Other similar methods are D1062-08 and D5041-98, neither of which are applicable to brittle adhesives and single interfaces.

In contrast, the present invention allows for the isolation of a single interface, as well as soft adhesives used to bond brittle materials, composed of a brittle/solid adhesive bonded to a solid material surface, and the determination of the force required to cleave or separate that interface.

This apparatus is not for measuring the adhesive properties of tapes, but it is for measuring the force required to break a single interface formed by two solid materials, where one material is the adhesive of interest. For example, the adhesion of ice to various coated or uncoated materials can be tested in this way. Many different specimen sizes can be accommodated, and a wide range of coating materials can be applied to the specimen surface so that the adhesive properties of coatings can be studied.

An aspect of the present invention is directed to a method of forming and testing a polycrystalline laminate on a substrate surface of a substrate. The substrate surface includes a substrate length edge having a substrate length and a substrate width edge having a substrate width. The polycrystalline laminate is to be formed on an edge of a notch edge formation piece disposed adjacent the substrate surface at the substrate width edge thereof, the edge of the notch edge formation piece being flush with the substrate surface and having an edge width at least equal to the substrate width and having a thickness which is substantially smaller than the substrate width of the substrate width edge. The polycrystalline laminate is to be formed to have a laminate width edge against a planar surface of a notch end formation piece disposed adjacent the notch edge formation piece, the planar surface of the notch end formation piece extending in a width direction at least along the edge width of the edge of the notch edge formation piece and extending in a height direction beyond the substrate surface and the edge of the notch edge formation piece to define a location for the laminate width edge. The method comprises: mounting the substrate, the notch edge formation piece, and the notch end formation piece to a sample holder with the substrate surface and the edge of the notch edge formation piece flush with one another and facing a liquid surface of a reservoir disposed in a chamber that provides an adjustable ambient temperature; seeding the substrate surface and the edge of the notch edge formation piece with seed droplets; lowering the substrate surface, the edge of the notch edge formation piece, and the notch end formation piece to the liquid surface of the reservoir; independently controlling a temperature of the substrate and the notch edge formation piece and a temperature of the reservoir to produce a temperature difference over a period of time for crystallization growth; and retracting the substrate surface and the edge of the notch edge formation piece from the liquid surface of the reservoir at a draw rate. The draw rate and the temperature difference are selected to grow polycrystalline laminate on the substrate surface and the edge of the notch edge formation piece.

In some embodiments, the notch edge formation piece and the substrate have approximately a same thermal conductivity and the notch end formation piece has a different thermal conductivity which is substantially lower than the thermal conductivity of the substrate. The polycrystalline laminate may be a polycrystalline ice laminate and the draw rate is a fixed rate selected to closely match a velocity of a freezing front of ice growth on the substrate surface and the edge of the notch edge formation piece.

In specific embodiments, the method further comprises, prior to lowering the substrate surface, the edge of the notch edge formation piece, and the notch end formation piece to the liquid surface of the reservoir, applying a lining material on the notch edge formation piece and the notch end formation piece to prevent the polycrystalline laminate from adhering to the notch edge formation piece and from adhering to the notch end formation piece.

In accordance with another aspect of this invention, a system of forming and testing a polycrystalline laminate comprises: a substrate including a substrate surface on which to form the polycrystalline laminate, the substrate surface including a substrate length edge having a substrate length and a substrate width edge having a substrate width; a notch edge formation piece having an edge on which to form the polycrystalline laminate, the edge of the notch edge formation piece disposed adjacent the substrate surface at the substrate width edge, the edge of the notch edge formation piece being flush with the substrate surface and having an edge width at least equal to the substrate width and having a thickness which is substantially smaller than the substrate width of the substrate width edge; a notch end formation piece disposed adjacent the notch edge formation piece and having a planar surface which extends in a width direction at least along the edge width of the edge of the notch edge formation piece and extends in a height direction beyond the substrate surface and the edge of the notch edge formation piece, the polycrystalline laminate to be formed to have a laminate width edge against the planar surface of the notch end formation piece; and a sample holder to mount the substrate, the notch edge formation piece, and the notch end formation piece for forming the polycrystalline laminate on the substrate and the edge of the notch edge formation piece with the laminate width edge against the planar surface of the notch end formation piece, the notch edge formation piece and the notch end formation piece being removable from the sample holder for testing to expose a notch of the polycrystalline laminate extending beyond the substrate width edge of the substrate surface. The notch edge formation piece and the substrate have approximately a same thermal conductivity and the notch end formation piece having a different thermal conductivity which is substantially lower than the thermal conductivity of the substrate.

In some embodiments, a tensile load head has a lip configured to contact the notch of the polycrystalline laminate and driven to move the polycrystalline laminate in a direction generally perpendicular to the substrate surface and away from the substrate surface. In other embodiments, a shear load head has a leading end configured to contact an end of the polycrystalline laminate and driven to move the polycrystalline laminate in a direction generally parallel to the substrate length edge of the substrate surface.

Yet another aspect of the invention is directed to a method of testing a polycrystalline laminate formed on a substrate surface of a substrate which is mounted to a sample holder, the substrate surface including a substrate length edge having a substrate length and a substrate width edge having a substrate width, the polycrystalline laminate having a notch extending beyond the substrate width edge of the substrate surface. The method comprises at least one of: for tensile cleavage testing, applying a tensile load on the notch of the polycrystalline laminate in a direction generally perpendicular to the substrate surface and away from the substrate surface; and for shear sliding testing, applying a shear load on the end of the polycrystalline laminate in a length direction generally parallel to the substrate length edge of the substrate surface.

In specific embodiments, the method further comprises: mounting the substrate, a notch edge formation piece, and a notch end formation piece to the sample holder, the edge of the notch edge formation piece disposed adjacent the substrate surface at the substrate width edge thereof, the edge of the notch edge formation piece being flush with the substrate surface and having an edge width at least equal to the substrate width and having a thickness which is substantially smaller than the substrate width of the substrate width edge, a planar surface of a notch end formation piece disposed adjacent the notch edge formation piece, the planar surface of the notch end formation piece extending in a width direction at least along the edge width of the edge of the notch edge formation piece and extending in a height direction beyond the substrate surface and the edge of the notch edge formation piece to define a location for a laminate width edge; forming the polycrystalline laminate on the substrate surface and the edge of the notch edge formation piece, the polycrystalline laminate having the laminate width edge against the planar surface of the notch end formation piece; and removing the notch edge formation piece and the notch end formation piece from the sample holder to expose the notch of the polycrystalline laminate extending beyond the substrate width edge of the substrate surface.

In accordance with another aspect, instead of the adhesion testing of a single bi-material interface between the substrate and the notched polycrystalline laminate, dual bi-material (sandwich-like) configurations can be used to test adhesives between two samples. The adhesion testing apparatus can be adapted to perform adhesion testing by tensile cleavage or shear sliding on a sandwiched adhesive structure. The sandwiched adhesive structure may include a specimen or sample (e.g., upper sample) adhered by a planar adhesive layer therebetween to another specimen or sample (e.g., lower sample) which is securely mounted to the backplate with a bracket. The upper sample has an overhang or notch that overhangs a bracket width edge of the bracket. Tensile loading can be applied to the notch of the upper sample to perform adhesion testing by tensile cleavage in a direction generally perpendicular to the planar adhesive layer. Shear loading can be applied to upper sample to perform adhesion testing by shear sliding in a direction generally parallel to the planar adhesive layer.

BRIEF DESCRIPTION OF THE DRAWINGS

Embodiments of the invention will become more fully apparent from the following detailed description, the appended claims, and the accompanying drawings in which like reference numerals identify similar or identical elements.

FIG. 1A shows the vertical draw tower including a sample holder to which the substrate is attached. FIG. 1B is a view of the sample holder showing a refrigerated circulating path for temperature control of the substrate via the sample holder.

FIG. 2 shows a table of the properties of materials used as substrates for the ice crystallization and adhesion experiments.

FIG. 3A shows temperature profiles of the various components of the ice growth system during crystallization of ice on aluminum. FIG. 3B shows the temperature profile (designated with arrow in the IR image inset) along the substrate-ice-water line at 60 minutes into an ice growth.

DETAILED DESCRIPTION

Figure 1A:
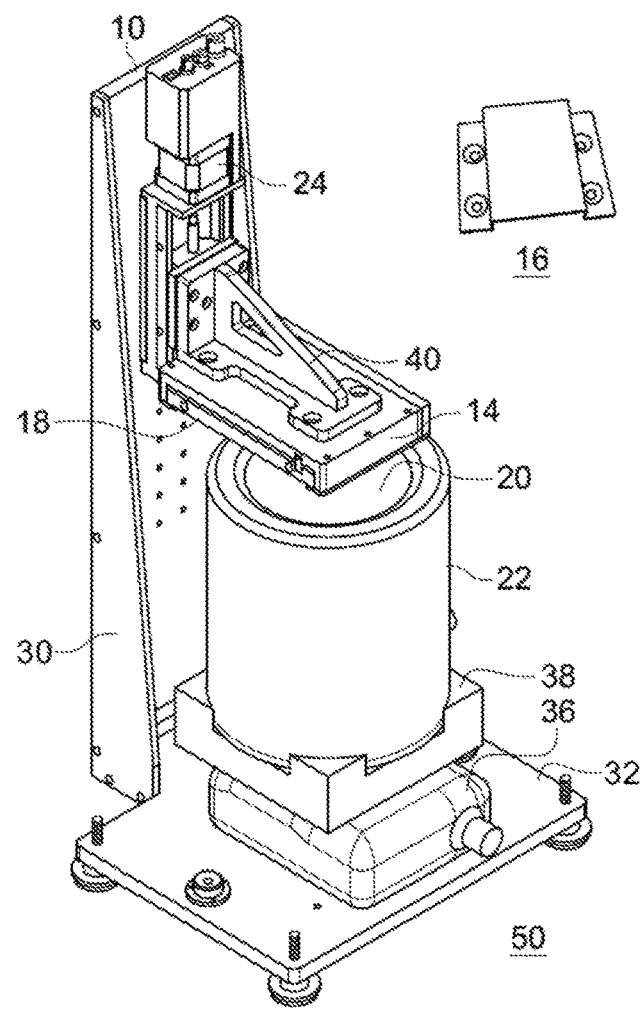
FIGS. 1A and 1B illustrate a crystallization apparatus used for growth of polycrystalline laminate such as polycrystalline ice laminate on a substrate surface employing a vertical draw method according to an embodiment of the present invention.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In at least one embodiment, the present invention aims to address the shortcoming of currently known techniques for growing polycrystalline ice by providing novel vertical draw method and apparatus to crystallize ice directly onto surfaces from a liquid water melt. The research shows that surface crystallization is induced by optimizing the temperature difference between the substrate and liquid water reservoir, and that seeding the substrates is used to obtain consistent polycrystalline columnar microstructures.

Embodiments of the present invention encompass the use of vertical draw systems and methods for growing polycrystalline laminates such as polycrystalline ice laminates on surfaces to achieve consistent polycrystalline columnar microstructures. For example, such techniques were used to grow freshwater ice on surfaces of different materials by crystallizing ice directly onto the surfaces from a liquid water melt. Seeding of the substrate and control of temperatures, temperature differences, and draw rate led to a crystallization approach that is broadly applicable to ice adhesion investigations on a wide range of surfaces.

Examples of ice adhesion investigations include adhesion testing of notched polycrystalline laminates or sandwiched adhesive structures. Adhesion testing is conducted by measuring the force required to break the substrate-laminate interface for the notched laminate or the sandwiched adhesive interface between two samples. Such adhesion testing may be performed by tensile cleavage or shear sliding. Tensile cleavage involves applying a tensile load head to lift the notched laminate from the substrate or lift one sample from the other sample at the sandwiched adhesive interface. Shear sliding involves applying a shear load head to slide the notched laminate along the substrate or slide one sample relative to the other sample at the sandwiched adhesive interface.

Vertical Draw System and Method for Surface Adhesion

Figure 1B:
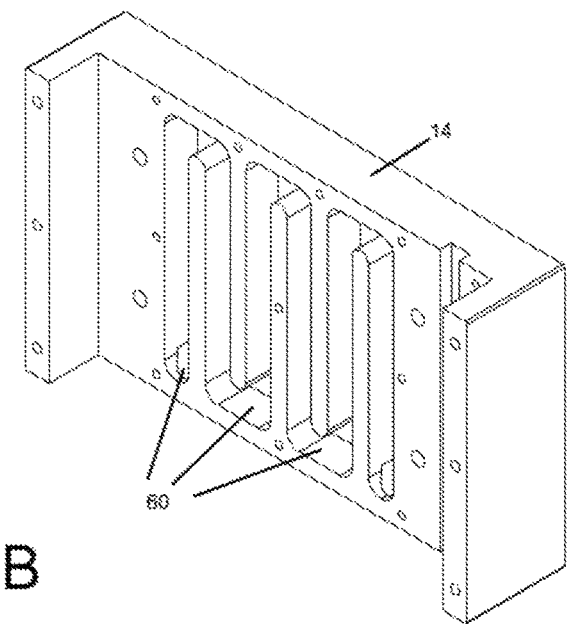

FIGS. 1A and 1B illustrates a crystallization apparatus 10 used for growth of polycrystalline laminate such as polycrystalline ice laminate on a substrate surface employing a vertical draw method. FIG. 1A shows the vertical draw tower 10 including a sample holder 14 to which the substrate 16 is attached. The crystallization tower 10 is designed to facilitate reproducible growth of freshwater columnar ice on surfaces for the purposes of ice adhesion studies. The design employs the vertical draw method of Czochralski, wherein a precisely tuned temperature gradient is used to pull crystals from the melt. See, e.g., J. Friedrich, Methods for Bulk Growth of Inorganic Crystals: Crystal Growth (2016). In the case of ice, the components of the apparatus had to operate at freezing temperatures with independent temperature control over the liquid reservoir and solid substrate. To crystallize ice directly on the substrate surface, a temperature-controlled sample holder 14 is provided to accommodate a substrate 16, which can be composed of a variety of materials and advanced material coatings.

The substrate 16 (inset) has the top surface upon which ice growth occurs and is mounted to a back plate 18 of the sample holder 14 in an inverted position to face the reservoir so that the top surface of the substrate 16 can be lowered to the liquid surface of a reservoir 20 provided in a container 22 by motion of a linear stage 24. The sample holder 14 and reservoir 20 are provided with independent temperature control to impose a thermal gradient that drives the crystallization from the melt process.

In one specific embodiment, the body or frame 30 of the crystallization tower (FIG. 1A) is composed of an aluminum frame, which is 64 cm tall with a 22.5×30 cm base 32. A stirred double-walled beaker 22 serves as the container for the liquid reservoir 20 and sits atop a stir plate 36. The stir plate 36 is anchored by an inset area in the base 32 of the frame 30 and a machined collar 38 is used to position the reservoir beaker 22 on the stir plate 36. Vertical drawing of the substrate 16 from the water surface of the reservoir 20 is achieved by motion of an arm 40 with the automated linear stage 24. Multiple screw holes on the backside of the tower body 30 allow the location of the linear stage 24 to be adjusted to different heights to accommodate different reservoir sizes. The entire assembly is positioned in a cold environmental chamber 50. The temperature of the cold chamber 50 is set at −14° C. in one specific embodiment.

FIG. 1B is a view of the sample holder 14 showing a refrigerated circulating path 60 for temperature control of the substrate 16 via the sample holder 14. The refrigerated circulating path 60 is typically a labyrinth of channels inside through which the temperature-controlled circulating coolant fluid (e.g., ethylene glycol) is flowed. The back plate 18 fits into the sample holder slot, keeps the cooling fluid within the circulating path, and transfers cooling from the cooling fluid to the substrate 16. Temperature control of the circulating fluid is achieved, for example, with an immersion circulator. The immersion circulator preferably has a programmable capability, which can be used to program a linear or nonlinear ramp from an initial temperature to a final temperature that is below the initial temperature, or to maintain a constant temperature setpoint.

Two separate immersion circulators are used to control the temperature of the reservoir 20 and the temperature of the substrate 16, respectively. During ice growth in a specific embodiment, the circulator that controls the reservoir temperature is set to 1.75° C. This temperature achieves a stable water surface temperature of 0.4±1° C. during ice growth when subject to the ambient temperature of the room (−14° C.). The circulator that controls the substrate temperature does so by circulating fluid through the refrigerated circulating path 60 of the sample holder 14. To ensure thermal equilibration of the substrate 16 with the sample holder 14, the assembly is allowed to equilibrate for about 30 minutes before crystallization is initiated. Water in the reservoir 20 is stirred at a rate of 60 rpm of the stir plate 36. Ice growth occurs directly on the inverted substrate 16 which is screw mounted onto an aluminum back plate 18. The automated linear stage 24 is used to bring the substrate 16 in contact with the water surface of the reservoir 20 and then withdraw the coupon at a fixed rate of about 0.9 µm/s for the duration of the ice growth in a specific embodiment. More specifically, the substrate 16 is lowered to the point where the substrate surface makes capillary contact with the liquid surface at the start of crystallization. As used herein, contact for crystallization means that the typically planar surface of the substrate is in capillary contact with the liquid surface of the reservoir. As the growth proceeds and the substrate 16 is raised, the substrate 16 moves away from the water surface, but the ice crystallization front remains in contact with the liquid surface of the reservoir due to the growth and thickening of the ice laminate on the substrate. Upon completion, the stage 24 then raises the substrate 16 fully away from the liquid surface.

The crystallization tower 10 was used to perform experiments for growth of ice on material surfaces employing crystallization from the melt technique. Specifics on the crystallization tower apparatus 10 are first presented, followed by its use for ice growth on different material surfaces. The characterization of substrate materials is addressed as well as the resulting ice microstructures and the implications of substrate properties on ice growth.

Experiments were carried out using the following materials: ultrapure de-ionized water (18.2 MΩ, Milli-Q, MilliporeSigma), coolant fluid composed of 50/50 water/ethylene glycol (Dynalene® EG, Dynalene, USA), acetyl resin (Delrin®, DuPont, USA), aluminum substrates (6061 alloy, McMaster-Carr), Teflon® (PFA, Chemours) applied via powder coating to a thickness of 25 µm (American Durafilm, USA), glass microscope slides (Corning, USA), and thermally conductive grease for mounting glass substrates (DeoxIT® Grease L260 copper particles).

All experiments were conducted in a digitally controlled environmental chamber 50 (Cincinnati Subzero, USA) at −14±1° C. Coolant was supplied to components with a refrigerated circulating bath (PC 200 Immersion Circulator, Thermo Scientific, USA) with 0.015° C. accuracy and a flow rate of 24 L/min. Deposition of starter seed crystals on the surface of substrates 16 was accomplished with a high volume low pressure (HVLP) spray gun (Model COM-G513G-18-05, DeVILBISS®, Carlisle Fluid Technologies, USA) with a compact fluid tip (SP-2005-085-K) operating at 30 PSI. A double-walled, jacketed glass beaker 22 (600 mL, Wilmad LabGlass, USA) was used as the liquid water reservoir wherein the temperature could be controlled by flowing coolant through the walls. A linear stage 24 was used to precisely raise and lower the substrate 16 to the water surface (Model X-LSQ075A-E01, Zaber Technologies, Canada). The stage 24 has a maximum continuous thrust of 100 N, a minimum speed of 0.061 µm/s, and a microstep size of 0.099 µm. A magnetic stir plate 36 (Corning, USA) was used to stir the reservoir water. Thin sections of ice crystals were formed with a sliding microtome (SM2400, Leica) in the cold chamber 50 at −15° C. Optical microscopy was performed under cross polarized light (SZH-10, Olympus, USA) and images were acquired with a digital microscope camera (Infinity 3-6URC, Lumenera, Canada). Dynamic contact angle was measured with a contact angle goniometer (Model 590, Rame-Hart, USA) equipped with an automatic tilting stage. The roughness of aluminum and Teflon substrates 16 was measured with a non-contact profilometer (PB1000, Nanovea, USA). The roughness of glass was measured with an atomic force microscope (Dimension Icon, Bruker, USA) operating in tapping mode. Thermal imaging was captured with an IR camera (Model E95, Flir, USA) and processed with ThermaCAM Researcher Pro. Temperature monitoring was performed with thermocouples (Type K) and a data acquisition system (Model cDAQ-9139, National Instruments, USA) at a sampling rate of 1 Hz.

The crystallization tower 10, employing digitally controlled temperature and a fully automated linear stage 24 for vertical motion, is a highly versatile and robust method for crystallizing ice on substrates. In addition to variable growth times and draw rates, the thermal difference across the substrate 16 and reservoir 20 can be tuned from exceedingly small to very large over a wide range of temperatures, only limited by the versatility of the circulator(s). This system can be used to access a variety of ice microstructures from nearly monocrystalline to random polycrystalline and co-oriented columnar microstructures. Most commonly, the system has been used to grow 1 cm thick ice laminates on 30×40 mm substrates in 2.5 h, but it has also been used to grow up to 4 cm thick ice laminates in 7 h, and on substrate areas up to 40×60 mm. The limitation on ice thickness is determined by the maximum travel of the linear stage 24 (75 mm in one configuration); the limitation on substrate area is set by the inner diameter of the reservoir (90 mm in one configuration). Reservoirs 20 with volumes up to 2000 mL have been used, which have an inner diameter of up to about 130 mm and can accommodate substrates up to 120 mm wide.

A broad range of materials can be used as substrates 16 in the crystallization tower 10. The only requirement is that the substrate be mountable to the 100×150 mm back plate 18, so machinable metals are easy candidates. In addition, machinable plastics (e.g., acetal resin or polycarbonate), or coated metals can be used. Typically, the experiments used aluminum substrates that were fabricated with a 30×40 mm raised plateau and were polished before use. These aluminum substrates are commonly used for the application of advanced material coatings.

To study the effect of material properties of the substrate on ice growth using the crystallization tower 10, aluminum, Teflon, and glass were selected since these materials represent a diversity of material properties. FIG. 2 shows a table of the properties of materials used as substrates for the ice crystallization and adhesion experiments. For example, while glass is very smooth (Ra=0.46±0.03 nm), polished aluminum substrates have intermediate roughness (Ra=0.29±0.01 µm) and Teflon is the roughest (Ra=1.29±0.27 µm). In addition, the materials have a range of wettabilities (contact angle) and thermal conductivities. The current ice growth studies utilized 30×40 mm polished aluminum substrates, a Teflon coating, which was commercially applied over the top surfaces of aluminum substrates, and 30×40 mm glass slides adhered to aluminum substrates with thermally conductive grease.

In preparation for ice growth, the substrate surfaces are cleaned with ultrapure water, allowed to dry, and then set to thermally equilibrate in the sample holder 14 of the ice tower 10 for 30 min. To direct nucleation of polycrystalline ice on the material surfaces, substrates 16 were seeded by spraying the pre-chilled surfaces with ultrapure water. Regardless of the surface wettability of the three materials used in the present study, the seed droplet sizes were statistically similar on each substrate: 14±6 µm on aluminum, 27±11 µm on Teflon, and 29±10 µm on glass. Consistent with delayed droplet freezing on hydrophobic and super-hydrophobic surfaces, seed droplets on Teflon required an additional 10 min to freeze before ice growth was induced on the surfaces.

The process of ice growth on surfaces begins with a 30 min thermal equilibration period, wherein the substrate 16 and back plate 18 are allowed to set in the sample holder 14 at an initial temperature ($T_i$), which depends on the material properties of the target substrate 16. For ice growth on aluminum and Teflon-coated aluminum, $T_i$ was set to −2° C. For growth on glass, $T_i$ was −4° C. After thermal equilibration, the substrates 16 were sprayed with seed droplets and returned to the crystallization tower 10. The substrates 16 were then lowered to the reservoir surface to begin the ice growth process and the substrate holder retraction is engaged.

Ice growth on the substrates 16 was conducted with a temperature ramp from $T_i$ to a final temperature ($T_f$) imposed on the substrate 16 while the reservoir 20 was held at a constant temperature (0.4±1° C. at the surface). For the growth of polycrystalline columnar ice, the substrate was held at $T_i$ for 30 min, then linearly ramped to $T_f$ over the course of 1.5 h, followed by a hold at $T_f$ for 30 min. For aluminum and Teflon-coated aluminum, $T_i$=−2° C. and $T_f$=−6° C. The glass substrates required $T_i$=−4° C. and $T_f$=−8° C. as a result of the low thermal conductivity of glass and the use of thermal grease to adhere to the aluminum substrate (see FIG. 2). It is noted that the linear temperature ramp is used to achieve stable removal of latent heat to keep crystallization growth rate matched to the draw rate (i.e., to achieve stable heat flux away from the growing ice front); other materials may require other types of ramping including nonlinear ramping, or isothermal substrate temperature.

Figure 3A:
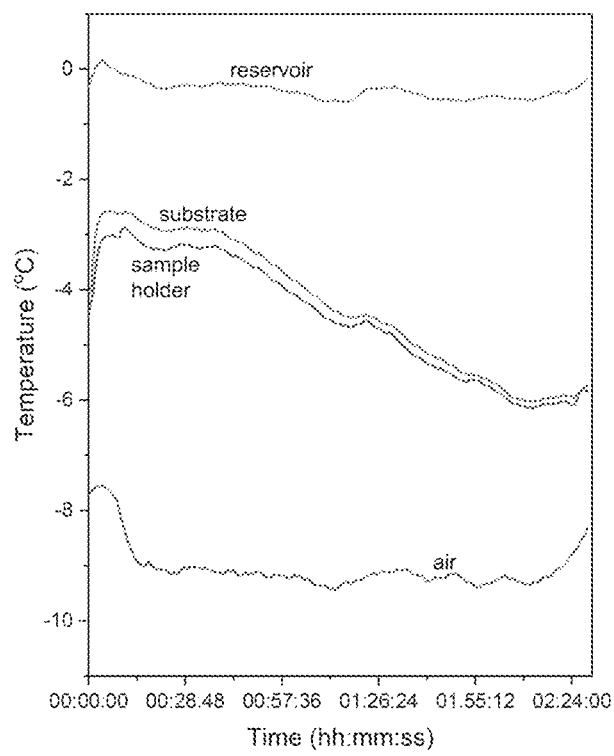
FIGS. 3A and 3B illustrate thermal conditions during crystallization of ice on aluminum substrates.
Figure 3B:
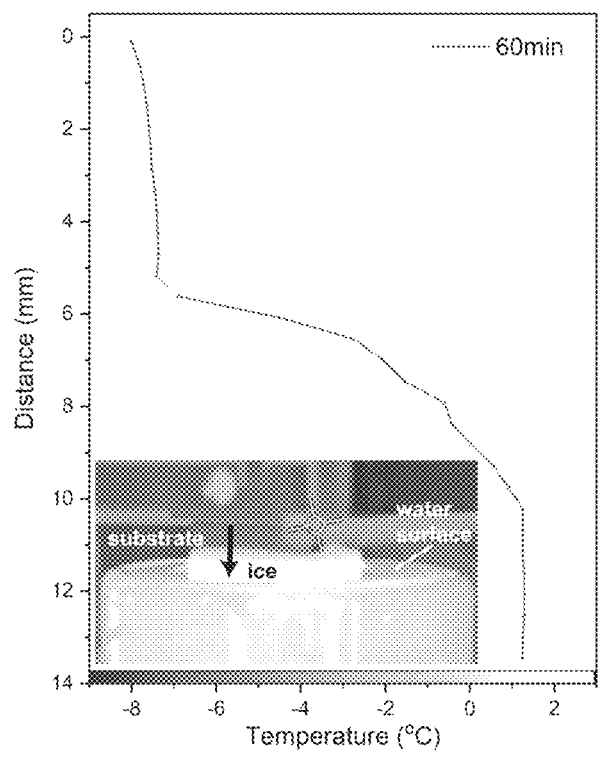

FIGS. 3A and 3B illustrate thermal conditions during crystallization of ice on aluminum substrates. FIG. 3A shows temperature profiles of the various components of the ice growth system 10 during crystallization of ice on aluminum. FIG. 3B shows the temperature profile (designated with arrow in the IR image inset) along the substrate-ice-water line at 60 minutes into an ice growth. The temperature profiles in FIG. 3A for the substrate 16 and sample holder 14 reflect the imposed temperature ramp from $T_i$ to $T_1$, while the temperature in the room 50 and reservoir 20 remain constant during crystallization.

Temperature monitoring was conducted with both IR imaging and thermocouples to characterize the thermal stability and gradients present during ice growth. The temperatures of the ambient air in the chamber 50, water reservoir 20, substrate 16, and sample holder 14 during ice crystallization on aluminum were recorded for the entire 2.5 h growth period as seen in FIG. 3A. The data show that the reservoir 20 remained at 0.4±1° C. for the entire duration of ice growth. While the room 50 had a set point of −14° C., the temperature in the immediate vicinity of the reservoirs was −9.0±1.0° C. and the temperature ramp imposed on the sample holder 14 was consistently translated to the substrate 16. The substrate temperature closely resembles the thermal profile imposed on the sample holder 14, indicating a temperature difference of 2.4° C. at the ice-water growth front at the start of crystallization. These measurements indicated a thermal difference of 2.4° C. at the ice-water growth front. The thermal difference is determined from the difference in start temperatures of the reservoir and substrate (FIG. 3A, t=0:00:00).

Images were taken with an IR camera at various time points during crystallization on aluminum to further characterize the thermal difference between the substrate 16 and reservoir 20. A snapshot of the conditions at 60 min is shown in FIG. 3B. This image indicates that the substrate 16 is at approximately −8±1° C. and the reservoir top is at 1±1° C. at 60 min into the growth process. While the IR values for the reservoir are consistent with the thermocouple data (FIG. 3A), the lower apparent substrate temperature is likely a result of the sample holder reflectivity, which introduces uncertainty into the IR measurement.

On a macroscale, the thermal conditions outlined above combined with a draw rate of 0.9 μm/s resulted in 1 cm thick ice laminates on the three different material substrates 16. The actual shape of each laminate was a close replicate of the underlying rectangular shape of each substrate 16 as a result of slow draw rate with a small initial undercooling of the substrate 16 at $T_i$, under conditions where the draw rate closely matched the velocity of the freezing front (e.g., to within 10%, more preferably to within 5%, most preferably to within 1%). While the experiments mostly utilized 30×40 mm interface area on the substrate, the same temperature profile can be used to form laminates on larger substrates of 40×60 mm. Additionally, continued growth for longer times at $T_i$, can be used to form thicker laminates. More specifically, for example, ice growth experiments on surfaces using the crystallization tower 10 have resulted in, for example, a 1 cm thick ice laminate grown on a 30×40 mm Teflon coated substrate in 2.5 h, a 1 cm thick ice laminate grown on a 40×60 mm Teflon coated substrate in 2.5 h, a 1 cm thick ice laminate grown on a 30×40 mm aluminum substrate in 2.5 h, a 4 cm thick ice laminate grown on a 30×40 mm aluminum substrate in 7 hours, and a 1.5 cm thick laminate grown on a 60×80 mm substrate in 3 hours.

All ice specimens exhibit a raised central area on the external surface of the ice. This feature is a result of both convective and conductive effects. Stirring the reservoir 20 impacts the convective flow in the reservoir 20; convective transfer of latent heat away from the center is more efficient in a stirred reservoir and has been associated with convex shaped growth of the crystal into the melt. In terms of conduction, heat transfer is most efficient in areas that have the greatest contact with the aluminum substrate (i.e., the substrate center), thus ice growth rate is increased due to the higher flux of latent heat away from the solid-liquid interface.

In this research, the goal is to grow ice laminates with columnar microstructures as the mechanical response of this ice is well characterized (see, e.g., D. Bentley et al., Fracture Toughness of Columnar Freshwater Ice from Large Scale DCB Tests, Cold Regions Science and Technology, 17 (1989) 7-20), which is a necessary requirement for ice adhesion studies. Columnar microstructures exist widely in nature as a result of growth in a temperature gradient, such as lake and sea ices and consists of elongated grains along the gradient with a tiled mosaic of grains with low aspect ratio and pseudo-hexagonal cross sections perpendicular to the gradient; in the plane of the water surface. To achieve columnar ice microstructures in the laminates grown in the crystallization tower 10, the substrate temperature was linearly ramped to lower temperatures during growth to facilitate the removal of latent heat of crystallization thereby maintaining a constant velocity of the crystallization front.

Thin sections of the ice laminates were imaged in cross-polarized light to study the microstructure. Ice grown on aluminum showed the characteristic mosaic of grains parallel to the plane of the substrate; elongated grains were seen in thin sections taken perpendicular to the substrate. The microstructure of ice laminates formed on Teflon under the same growth conditions showed more irregularly shaped grains in the plane of the substrate, but the grains were still elongated along the thickness of the laminate. The ice laminates grown on glass had the characteristic columnar microstructures, similar to laminates on aluminum, even though they were grown at larger undercooling.

The crystallization system 10 used here to adhere ice to different material surfaces by a vertical draw, crystallization-from-the-melt technique is highly versatile and able to access a wide range of ice microstructures depending on the thermal difference, draw rate, and time as well as pre-seeding of the interface. The ability to separately control the substrate and reservoir temperatures allowed the inventors to customize the undercooling and thermal gradient to grow ice at different temperatures and on material surfaces with different thermal, physical, and chemical properties.

The thermal conductivity of the materials, as well as the thickness of coatings, affects the conditions needed to grow ice laminates on the materials. For example, while aluminum, with the highest thermal conductivity (196 W/mK), could be grown with $T_i$=−2° C. and $T_f$=−6° C., glass, an insulator, required $T_i$=−4° C. and $T_f$=−8° C., as it is less effective at removing the latent heat. On the other hand, Teflon has a thermal conductivity (0.25 W/mK) which is lower than glass (0.96 W/mK), but ice laminates could be grown at smaller undercooling because it was only present as a thin (25 μm) coating. These findings are consistent with reports from droplet freezing on surfaces, wherein the temperature between the droplet and substrate is dominated by the heat conduction of the substrate. See, e.g., L Mishchenko et al., Design of Ice-Free Nanostructured Surfaces Based on Repulsion of Impacting Water Droplets, ACS Nano, 4 (2010) 7699-7707.

The surface roughness of the substrate material affects the microstructure of the ice grown on surfaces under identical thermal conditions. For example, while columnar ice laminates were grown on both aluminum and Teflon substrates with $T_i=-2°$ C. and $T_f=-6°$ C., the shape of the ice grains in the plane of the Teflon substrate were only negligibly pseudo-hexagonal. This observation is in alignment with other reports that have found the structure of ice grown on a surface is impacted by that surface. See, e.g., M. J. Shultz, Ice Surfaces, Annual Review of Physical Chemistry, 68 (2017) 285-304. In the case of Teflon versus aluminum, the Teflon surfaces are rough (1.29±0.27 μm) as compared to the polished aluminum (0.29±0.01 μm), as well as glass (Ra=0.46±0.03 nm), which is a likely contributor to the irregular microstructure.

The results presented herein also illustrate how the wettability of the substrate materials affects ice crystallization and microstructure. Consider hydrophobic Teflon, with high contact angle (114±2/96±2) as compared to aluminum and glass (71±2/44±3 and 28±2/17±2, respectively). All other things being constant, hydrophobic surfaces are known to inhibit droplet freezing. This reality may also be relevant to the freezing of bulk water on Teflon surfaces, causing the microstructure at the interface to experience delayed, irregular freezing, contributing to the irregular grain shape in the plane of the Teflon substrate.

A crystallization tower, based on the vertical draw, crystallization-from-the-melt technique of Czochralski, was designed, constructed, and validated for the growth of columnar ice on a range of material surfaces. The crystallization tower is highly versatile, with adjustable substrate and reservoir temperatures, variable stir and draw rate, and can accommodate a range of substrate sizes. Due to the versatility of the substrate and reservoir temperatures as well as the draw rate, growth conditions can be tuned to the properties of materials of interest to ice adhesion studies. The present technique differs from the traditional Czochralski method, which has been widely applied to obtain single crystals of semiconductors that require crystallization temperature over +1000° C. due to their high melting points. In contrast, the present system and method can be used to obtain polycrystalline laminates by crystallizing any materials that crystallize at temperatures well under +1000° C., for instance, under about +100° C. and, more specifically, over the temperature range of about −30° C. to about +70° C., which is the temperature range of the coolant supplied to the sample holder for the substrate and to the reservoir using a tubing made of a polymeric material for crystallizing water and other low melting point compounds such as paraffin, oleic acid, dimethylsulfoxide, polycyclic aromatic hydrocarbons, or the like, according to specific embodiments of the invention.

While the focus of this disclosure is on the formation of polycrystalline columnar ice microstructures, with small thermal differences and slow withdraw rates, ice with large crystalline domains, which approach monocrystalline, can also be formed in this same system. Conversely, under large, cold temperature differences, ice laminates with random polycrystalline microstructure are formed on the substrate. With intermediate temperature differences and seeding, and minor adjustments to the undercooling, this crystallization tower can be used to grow ice with columnar microstructures, in a highly robust and automated fashion, which is of great utility to ice adhesion studies.

The size of the ice laminates is only limited by the reservoir diameter (lateral dimension) and the travel distance of the linear stage 24. With the current reservoir size of 600 mL, the largest substrate that can be used is up to 60 mm diameter and the tallest (thickest laminate) crystal that can be grown is 75 mm, provided the reservoir is periodically refilled. Larger reservoirs (e.g., 2000 mL and 5000 mL) have been implemented to further broaden the impact of this system for crystallization of ice on a wide range of surface types and sizes, and the growth of a large range of ice crystals for fundamental studies. The 2000 mL reservoir is compatible with the existing tower frame size; the largest reservoir (5000 mL) is used with a crystallization tower that has a body or frame that is about 64 cm tall with a 41×44.5 cm base.

Figure 4:
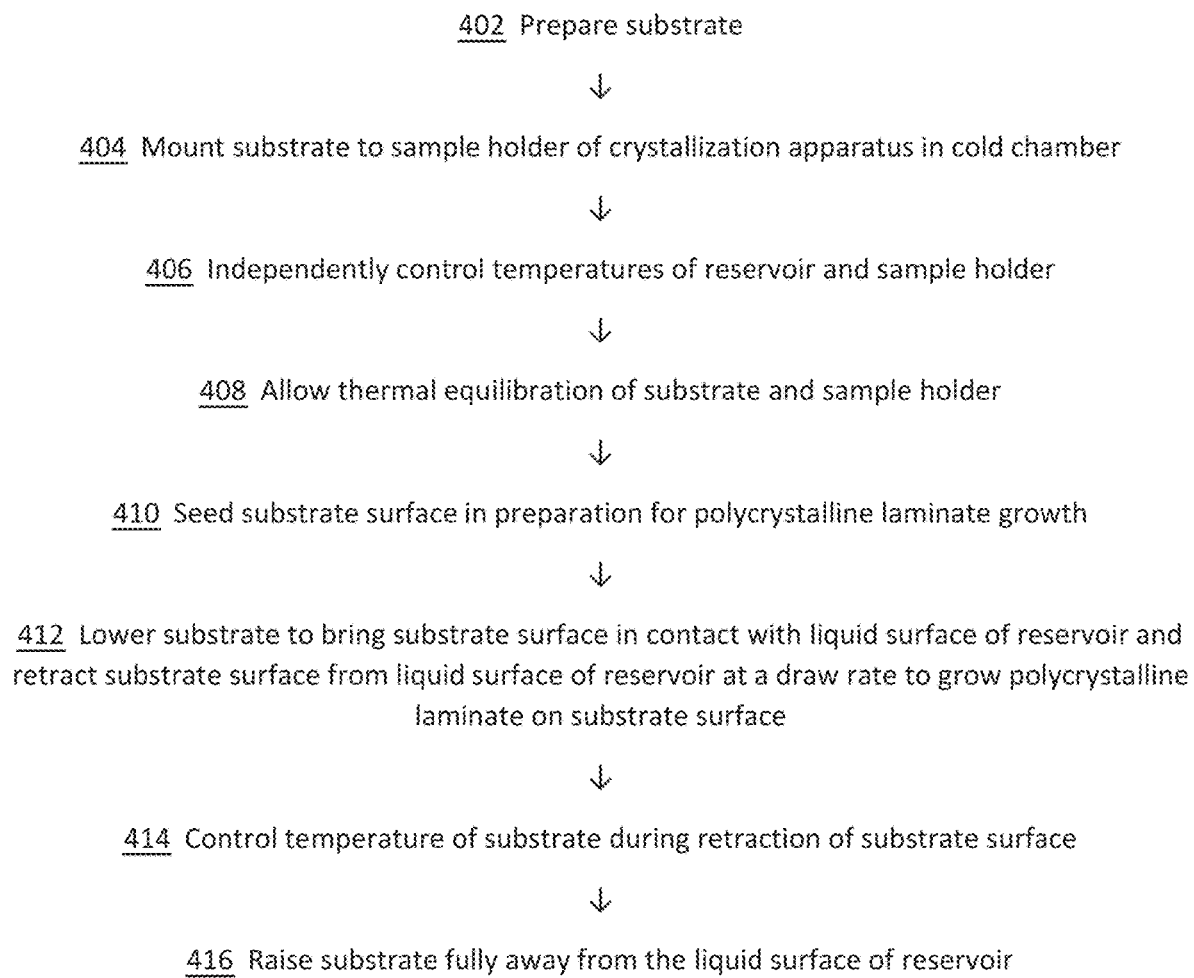
FIG. 4 is a flow diagram of the crystallization process for forming polycrystalline laminate such as polycrystalline ice laminate using the vertical draw apparatus according to an embodiment of the present invention.

FIG. 4 is a flow diagram of the crystallization process for forming polycrystalline laminate such as polycrystalline ice laminate using the vertical draw apparatus according to an embodiment of the present invention. In step 402, the substrate 16 is prepared (e.g., by cleaning the substrate surface with ultrapure water and allowing it to dry). In step 404, the substrate 16 is mounted to the back plate 18 of the sample holder 14 and the vertical draw apparatus 10 is placed in the cold chamber 50 set to a desired chamber temperature (e.g., about −14° C.).

In step 406, the temperature of the reservoir 20 is controlled (e.g., by immersion circulation and using the stir plate 36 at a rate of about 60 rpm and set to about 1.75° C.) and the temperature of the sample holder is controlled independently of the temperature control of the reservoir 20 (e.g., by circulating fluid through the sample holder 14). In step 408, to ensure thermal equilibration of the substrate 16 with the sample holder 14, the assembly is allowed to equilibrate for a period of time (e.g., about 30 minutes) before crystallization is initiated. A stable water surface temperature is achieved for ice growth (e.g., about 0.4±1° C.). During the thermal equilibration, the substrate 16 and back plate 18 are allowed to set in the sample holder 14 at an initial temperature ($T_i$), which depends on the material properties of the target substrate 16. For ice growth on aluminum and Teflon-coated aluminum, $T_i$ was set to about −2° C. For growth on glass, $T_i$ was set to about −4° C. In step 410, after thermal equilibration, the substrate 16 is sprayed with seed droplets and returned to the crystallization tower 10. To direct nucleation of polycrystalline ice on the material surfaces, the substrate 16 is seeded by spraying the pre-chilled surface of the substrate with ultrapure water. Regardless of the surface wettability of the substrate materials used, the seed droplet sizes are statistically similar on each substrate: e.g., about 14±6 μm on aluminum; about 27±11 μm on Teflon; and about 29±10 μm on glass. Consistent with delayed droplet freezing on hydrophobic and super-hydrophobic surfaces, seed droplets on Teflon required an additional 10 min to freeze before ice growth was induced on the surfaces.

In step 412, the automated linear stage 24 is used to lower the substrate 16 and bring the substrate surface in capillary contact with the liquid surface of the reservoir 20. The substrate holder retraction is engaged, for example, by withdrawing the coupon at a fixed rate of about 0.9 μm/s for the duration of the ice growth. During substrate holder retraction and ice growth, in step 414, the temperature of the substrate 16 is controlled with a temperature ramp from $T_i$ to a final temperature ($T_f$) while the reservoir 20 was held at a constant temperature (e.g., about 0.4±0.2° C. at the reservoir surface). For the growth of polycrystalline columnar ice, the substrate 16 is held at $T_i$ for 30 min, then linearly ramped to $T_f$ over the course of about 1.5 h, followed by a hold at $T_f$ for about 30 min in a specific embodiment. For aluminum and Teflon-coated aluminum, $T_i$=about −2° C. and $T_f$=about −6° C. For glass substrates, $T_i$=about −4° C. and $T_f$=about −8° C. as a result of the low thermal conductivity of glass and the use of thermal grease to adhere to the aluminum substrate. Upon completion of the ice growth process, in step 416, the stage 24 then raises the substrate 16 fully away from the liquid surface of the reservoir 20 by lifting the substrate holder 14.

In specific embodiments, as in the above examples involving different substrate materials, to achieve stable growth conditions (e.g., rectangular ice laminates that match the rectangular substrate shape), the net heat flow through the substrate must match the rate at which heat is generated by the crystallization process (see, e.g., D. T. J. Hurle, "Crystal Pulling from the Melt," Springer-Verlag, 1993). Essentially, the velocity of the freezing front (e.g., the ice crystallization growth rate) is determined by the ambient temperature in the chamber 50, liquid surface temperature of the reservoir 20, initial temperature $T_i$ and final temperature $T_1$ of the substrate 16, linear temperature ramping from $T_i$ to $T_1$, diameters of the substrate and reservoir, as well as the densities of the liquid and solid (water and ice in this case). The draw rate of the substrate 16 is selected to closely match the velocity of the freezing front. Under these conditions and using appropriate seeding of the substrate surface with seed droplets, it is possible to achieve consistent polycrystalline columnar microstructures. While the velocity of the freezing front for given reservoir size and draw rate and cylindrical seed crystal size can be calculated for a single crystal growth on a seed, such a mathematical expression does not fit the present scenario of polycrystalline growth on a rectangular substrate. As such, numerous tuning experiments are used to bring the draw rate and velocity of the freezing front into confluence. The information on these parameters can be collected in a database and stored (e.g., in a computer-readable storage medium), and be provided for use by any entity to grow ice on surfaces of different materials in a reproducible manner using the vertical draw system and method. The stored information may include information on substrate materials, the seed droplets, the ambient temperature, the temperature of the substrate (including the stir rate of a stir plate if it is used to control the temperature of the reservoir), the temperature of the reservoir, the temperature difference between the substrate and the reservoir over the period of time for crystallization growth, and draw rate. Because the stored information has previously been used to grow polycrystalline ice with columnar microstructures on the substrate surface for different substrate materials, standard methods for ice adhesion testing and analysis are possible.

Figure 5:
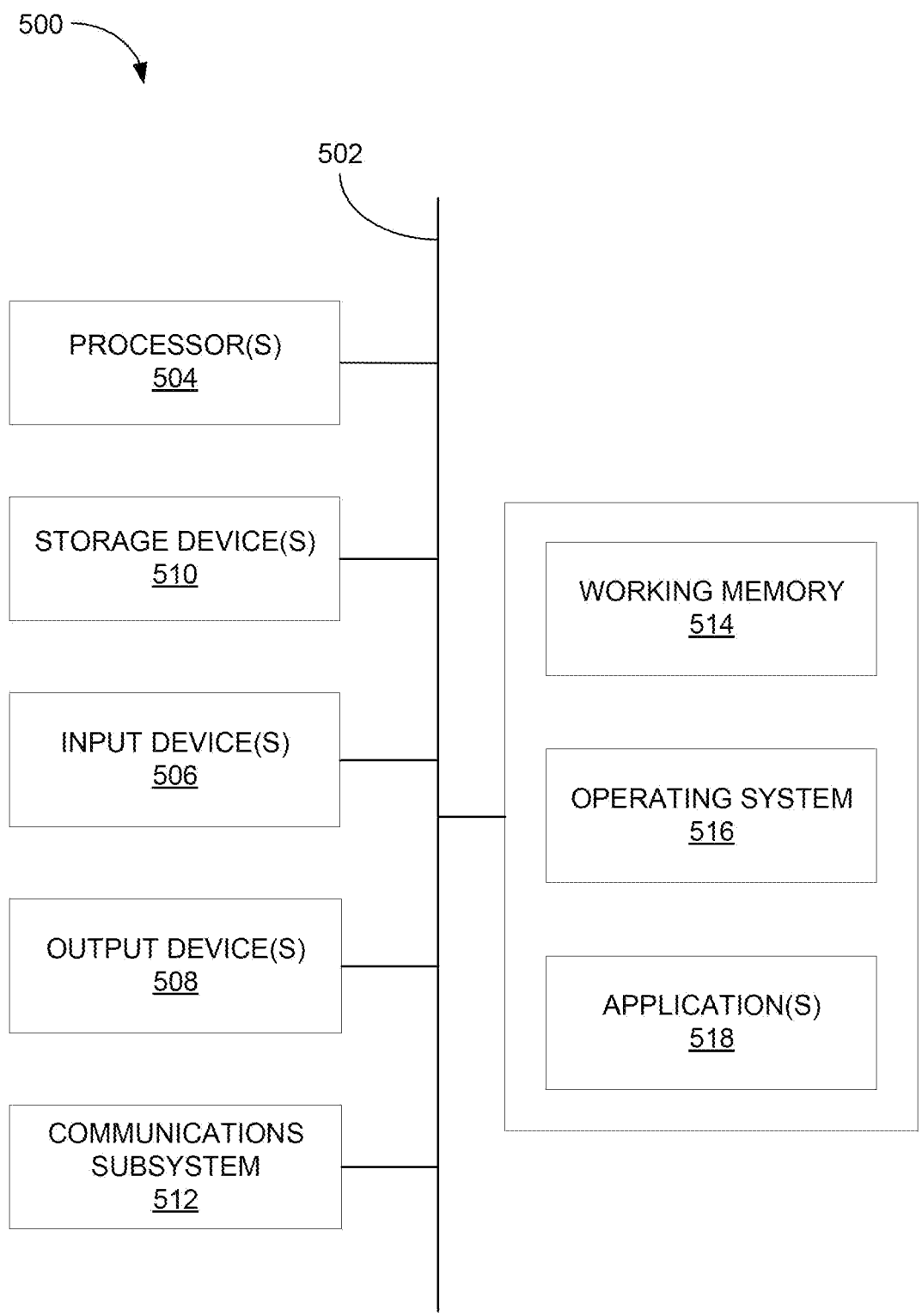
FIG. 5 depicts an exemplary computer system or device configured for use with the vertical draw apparatus according to an embodiment of the present invention.

FIG. 5 depicts an exemplary computer system or device 500 configured for use with the vertical draw apparatus 10 according to an embodiment of the present invention. An example of a computer system or device 500 may include an enterprise server, blade server, desktop computer, laptop computer, tablet computer, personal data assistant, smartphone, any combination thereof, and/or any other type of machine configured for performing calculations. Any computing devices encompassed by embodiments of the present invention may be wholly or at least partially configured to exhibit features similar to the computer system 500.

The computer device 500 of FIG. 5 is shown comprising hardware elements that may be electrically coupled via a bus 502 (or may otherwise be in communication, as appropriate). The hardware elements may include a processing unit with one or more processors 504, including without limitation one or more general-purpose processors and/or one or more special-purpose processors (such as digital signal processing chips, graphics acceleration processors, and/or the like); one or more input devices 506, which may include without limitation a remote control, a mouse, a keyboard, and/or the like; and one or more output devices 508, which may include without limitation a presentation device (e.g., controller screen), a printer, and/or the like. Input to the computer system 500 may be provided by the sample holder temperature control device such as an immersion circulator to control a temperature of the sample holder, the reservoir temperature control device such as another immersion circulator to control a temperature of the reservoir, and the linear stage 24 to control movement of the substrate.

In some cases, an output device 508 may include, for example, a display subsystem, a printer, a fax machine, or non-visual displays such as audio output devices. The display subsystem may be a cathode ray tube (CRT), a flat-panel device such as a liquid crystal display (LCD), a projection device, or the like. The display subsystem may also provide a non-visual display such as via audio output devices. In general, use of the term "output device" is intended to include a variety of conventional and proprietary devices and ways to output information from computer system 500 to a user.

The computer system 500 may further include (and/or be in communication with) one or more non-transitory storage devices 510, which may comprise, without limitation, local and/or network accessible storage, and/or may include, without limitation, a disk drive, a drive array, an optical storage device, a solid-state storage device, such as a random access memory, and/or a read-only memory, which may be programmable, flash-updateable, and/or the like. Such storage devices may be configured to implement any appropriate data stores, including without limitation, various file systems, database structures, and/or the like.

The computer device 500 can also include a communications subsystem 512, which may include without limitation a modem, a network card (wireless and/or wired), an infrared communication device, a wireless communication device and/or a chipset such as a Bluetooth device, 802.11 device, WiFi device, WiMax device, cellular communication facilities such as GSM (Global System for Mobile Communications), W-CDMA (Wideband Code Division Multiple Access), LTE (Long Term Evolution), and the like. The communications subsystem 512 may permit data to be exchanged with a network (such as the network described below, to name one example), other computer systems, controllers, and/or any other devices described herein. In many embodiments, the computer system 500 can further comprise a working memory 514, which may include a random access memory and/or a read-only memory device, as described above.

The computer device 500 also can comprise software elements, shown as being currently located within the working memory 514, including an operating system 516, device drivers, executable libraries, and/or other code, such as one or more application programs 518, which may comprise computer programs provided by various embodiments, and/or may be designed to implement methods, and/or configure systems, provided by other embodiments, as described herein. By way of example, one or more procedures described with respect to the method(s) discussed above, and/or system components might be implemented as code and/or instructions executable by a computer (and/or a processor within a computer); in an aspect, then, such code and/or instructions may be used to configure and/or adapt a general purpose computer (or other device) to perform one or more operations in accordance with the described methods.

A set of these instructions and/or code can be stored on a non-transitory computer-readable storage medium, such as the storage device(s) 510 described above. In some cases, the storage medium might be incorporated within a computer system, such as computer system 500. In other embodiments, the storage medium might be separate from a computer system (e.g., a removable medium, such as flash memory), and/or provided in an installation package, such that the storage medium may be used to program, configure, and/or adapt a general purpose computer with the instructions/code stored thereon. These instructions might take the form of executable code, which is executable by the computer device 500 and/or might take the form of source and/or installable code, which, upon compilation and/or installation on the computer system 500 (e.g., using any of a variety of generally available compilers, installation programs, compression/decompression utilities, and the like), then takes the form of executable code.

It is apparent that substantial variations may be made in accordance with specific requirements. For example, customized hardware might also be used, and/or particular elements might be implemented in hardware, software (including portable software, such as applets, and the like), or both. Further, connection to other computing devices such as network input/output devices may be employed.

As mentioned above, in one aspect, some embodiments may employ a computer system (such as the computer device 500) to perform methods in accordance with various embodiments of the disclosure. According to a set of embodiments, some or all of the procedures of such methods are performed by the computer system 500 in response to processor 504 executing one or more sequences of one or more instructions (which might be incorporated into the operating system 516 and/or other code, such as an application program 518) contained in the working memory 514. Such instructions may be read into the working memory 514 from another computer-readable medium, such as one or more of the storage device(s) 510. Merely by way of example, execution of the sequences of instructions contained in the working memory 514 may cause the processor(s) 504 to perform one or more procedures of the methods described herein.

The terms "machine-readable medium" and "computer-readable medium," as used herein, can refer to any non-transitory medium that participates in providing data that causes a machine to operate in a specific fashion. In an embodiment implemented using the computer device 500, various computer-readable media might be involved in providing instructions/code to processor(s) 504 for execution and/or might be used to store and/or carry such instructions/code. In many implementations, a computer-readable medium is a physical and/or tangible storage medium. Such a medium may take the form of a non-volatile media or volatile media. Non-volatile media may include, for example, optical and/or magnetic disks, such as the storage device(s) 510. Volatile media may include, without limitation, dynamic memory, such as the working memory 514.

Exemplary forms of physical and/or tangible computer-readable media may include a floppy disk, a flexible disk, hard disk, magnetic tape, or any other magnetic medium, a compact disc, any other optical medium, ROM, RAM, and the like, any other memory chip or cartridge, or any other medium from which a computer may read instructions and/or code. Various forms of computer-readable media may be involved in carrying one or more sequences of one or more instructions to the processor(s) 504 for execution. By way of example, the instructions may initially be carried on a magnetic disk and/or optical disc of a remote computer. A remote computer might load the instructions into its dynamic memory and send the instructions as signals over a transmission medium to be received and/or executed by the computer system 500.

The communications subsystem 512 (and/or components thereof) generally can receive signals, and the bus 502 then can carry the signals (and/or the data, instructions, and the like, carried by the signals) to the working memory 514, from which the processor(s) 504 retrieves and executes the instructions. The instructions received by the working memory 514 may optionally be stored on a non-transitory storage device 510 either before or after execution by the processor(s) 504.

It should further be understood that the components of computer device 500 can be distributed across a network. For example, some processing may be performed in one location using a first processor while other processing may be performed by another processor remote from the first processor. Other components of computer system 500 may be similarly distributed. As such, computer device 500 may be interpreted as a distributed computing system that performs processing in multiple locations. In some instances, computer system 500 may be interpreted as a single computing device, such as a distinct laptop, desktop computer, or the like, depending on the context.

A processor may be a hardware processor such as a central processing unit (CPU), a graphic processing unit (GPU), or a general-purpose processing unit. A processor can be any suitable integrated circuits, such as computing platforms or microprocessors, logic devices and the like. Although the disclosure is described with reference to a processor, other types of integrated circuits and logic devices are also applicable. The processors or machines may not be limited by the data operation capabilities. The processors or machines may perform 512 bit, 256 bit, 128 bit, 64 bit, 32 bit, or 16 bit data operations.

Each of the calculations or operations discussed herein may be performed using a computer or other processor having hardware, software, and/or firmware. The various method steps may be performed by modules, and the modules may comprise any of a wide variety of digital and/or analog data processing hardware and/or software arranged to perform the method steps described herein. The modules optionally comprising data processing hardware adapted to perform one or more of these steps by having appropriate machine programming code associated therewith, the modules for two or more steps (or portions of two or more steps) being integrated into a single processor board or separated into different processor boards in any of a wide variety of integrated and/or distributed processing architectures. These methods and systems will often employ a tangible media embodying machine-readable code with instructions for performing the method steps described herein. All features of the described systems are applicable to the described methods mutatis mutandis, and vice versa. Suitable tangible media may comprise a memory (including a volatile memory and/or a non-volatile memory), a storage media (such as a magnetic recording on a floppy disk, a hard disk, a tape, or the like; on an optical memory such as a CD, a CD-R/W, a CD-ROM, a DVD, or the like; or any other digital or analog storage media), or the like. While the exemplary embodiments have been described in some detail, by way of example and for clarity of understanding, those of skill in the art will recognize that a variety of modification, adaptations, and changes may be employed.

System and Method for Adhesion Testing of Brittle Materials

Figure 6A:
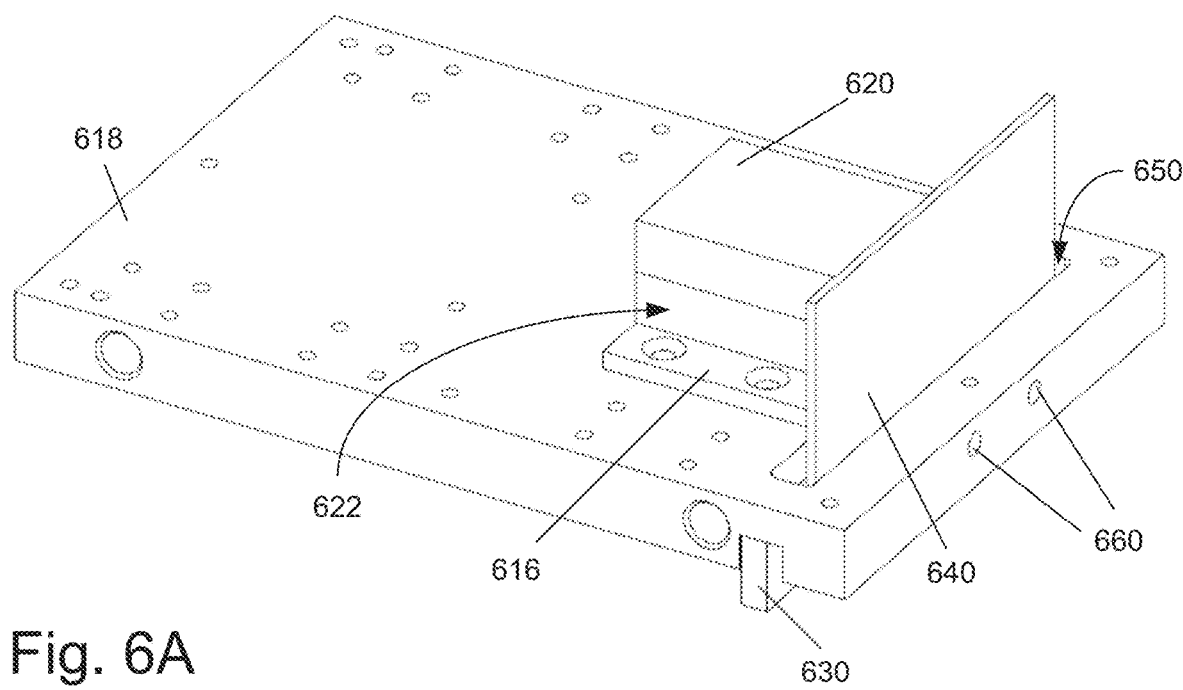
FIG. 6A is a perspective view of an assembly of supporting a substrate for forming polycrystalline laminate such as polycrystalline ice laminate with a notch using notch formation pieces according to an embodiment of the invention.
Figure 6B:
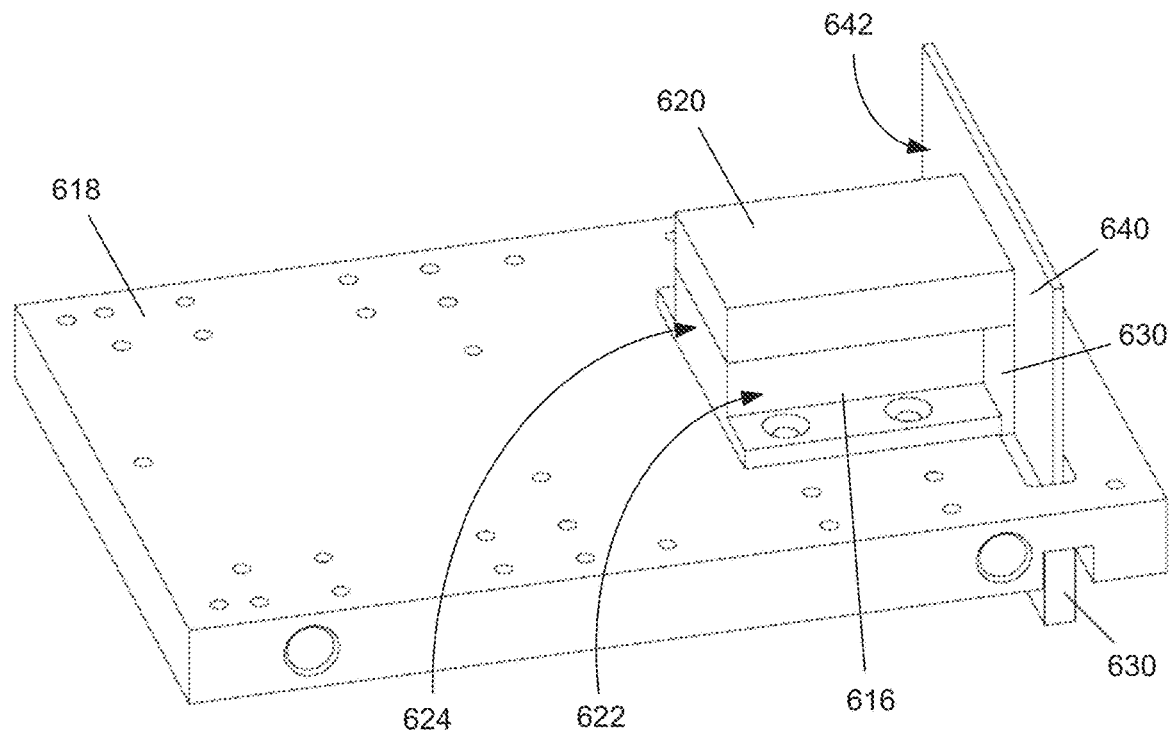
FIG. 6B is another perspective view of the assembly of FIG. 6A.
Figure 7:
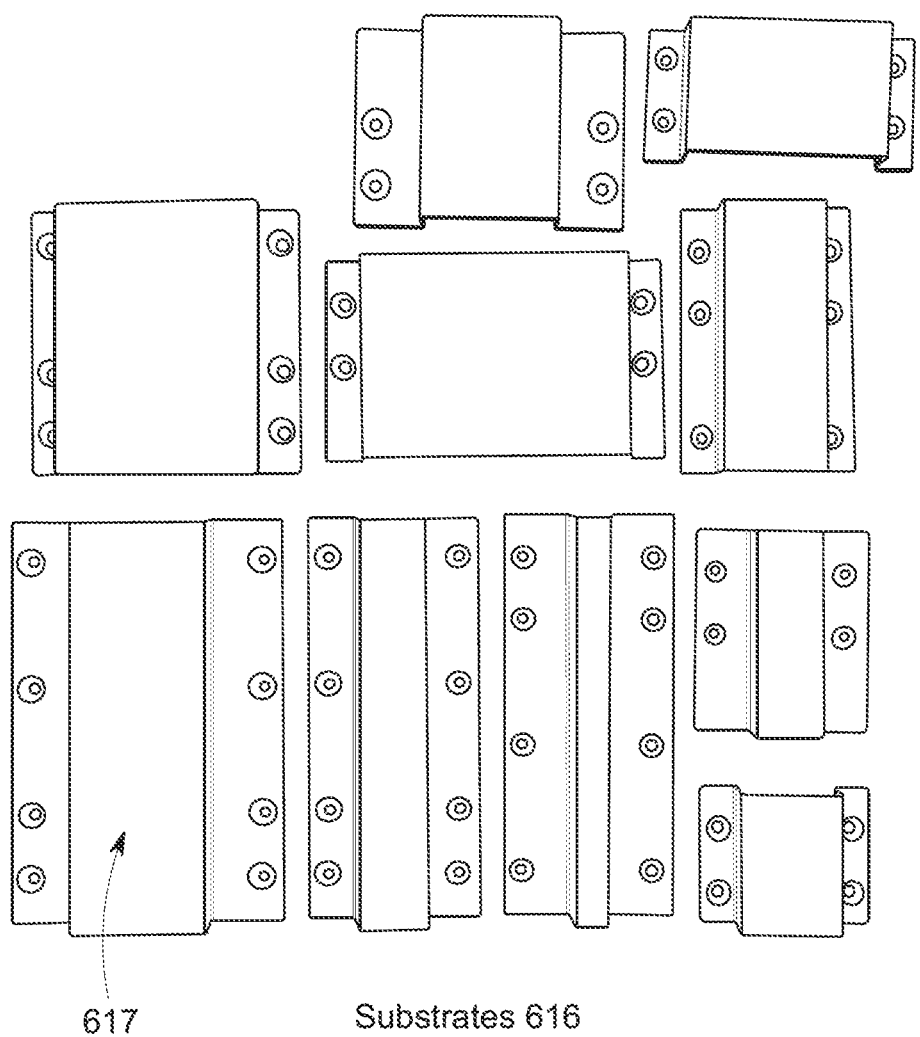
FIG. 7 shows examples of substrates of various sizes.

FIG. 6A is a perspective view of an assembly of supporting a substrate for forming polycrystalline laminate such as polycrystalline ice laminate with a notch using notch formation pieces according to an embodiment of the invention. FIG. 6B is another perspective view of the assembly of FIG. 6A. FIG. 7 shows examples of substrates of various sizes.

A backplate 618 (similar to 18 in FIG. 1A) of a sample holder (see 904 in FIG. 9) is provided to accommodate a substrate 616 for adhesion testing, which can be composed of a variety of materials in their native states or finished with various advanced material coatings. The substrate 616 has a top surface or substrate surface 617 upon which polycrystalline growth such as ice growth occurs and is mounted to the backplate 618 of the sample holder in an inverted position to face the reservoir so that the substrate surface 617 of the substrate 616 can be lowered to the liquid surface of a reservoir provided in a container by motion of a linear stage (see FIG. 1A) to form a laminate 620, such as polycrystalline ice laminate. The backplate 618 may have an overall nominal size of about 4×6 inches. The substrate surface 617 includes a substrate length edge 622 having a substrate length on each length side and a substrate width edge 624 having a substrate width on each width side.

A notch edge formation piece 630 and a notch end formation piece 640 are used to form a notch on the laminate 620. The notch edge formation piece 630 has an edge with a width to match the substrate width of the substrate surface 617 of the substrate 616 and a thickness that is substantially smaller than the substrate length and the substrate width of the substrate surface 617 of the substrate 616 (e.g., at about half the substrate width, such as 5 mm thickness compared to 10 mm substrate width). This thickness will be approximately the size of a notch (632 in FIG. 11) on the laminate 620.

When installed, the edge of the notch edge formation piece 630 is flush with the substrate surface 617 of the substrate 616 to form the notch of the laminate 620 overhanging an end (substrate width edge 624) of the substrate 616. The edge of the notch edge formation piece 630 is disposed adjacent the substrate surface 617 at the substrate width edge 624. The edge has an edge width at least equal to the substrate width and has a thickness which is substantially smaller than the substrate width of the substrate 616.

The notch end formation piece 640 is disposed adjacent the notch edge formation piece 630 and has a planar surface 642 which is pressed against the notch edge formation piece 630. The planar surface 642 extends in a width direction at least along the edge width of the edge of the notch edge formation piece 630 and extends in a height direction beyond the substrate surface 617 and the edge of the notch edge formation piece 630. The width of the planar surface 642 is equal to or greater than the edge width of the notch edge formation piece 630. When installed, the notch edge formation piece 630 is sandwiched between the end of the substrate 620 and the notch end formation piece 640 to form a laminate width edge of the laminate 620 which extends beyond the end of the substrate 620 by the thickness of the notch edge formation piece 630. The laminate width edge of the polycrystalline laminate 620 is formed against the planar surface 642 of the notch end formation piece 640.

In the embodiment shown, the notch edge formation piece 630 and the notch end formation piece 640 extend through a slot 650 in the backplate 618 and are attached to the backplate 618 using two or more screws or bolts 660. Other attachment mechanisms may be used. The notch edge formation piece 630 and the notch end formation piece 640 are removable from the backplate 618 of the sample holder (e.g., by releasing the fasteners 660) for testing to expose a notch (632 in FIG. 11) of the polycrystalline laminate 620 extending beyond the substrate width edge 624 of the substrate surface 617.

To grow the laminate 620 properly, the notch edge formation piece 630 has a thermal conductivity that is close to or same as the thermal conductivity of the substrate 616, and the notch end formation piece 640 has a different thermal conductivity that is substantially lower than the thermal conductivity of the notch edge formation piece 630. In this way, the notch end formation piece 640 does not cause laminate growth on itself but rather serves to insulate against heat transfer due to the substantially lower thermal conductivity. In one example, the notch edge formation piece 630 is made of metal and may be made of the same material as the substrate 616, such as aluminum, while the notch end formation piece 640 is made of plastic.

FIG. 7 shows examples of substrates of various sizes. For each substrate 616 having a substrate surface 617 with a length and a width, appropriately sized notch edge formation piece 630 and notch end formation piece 640 are used.

Figure 8:
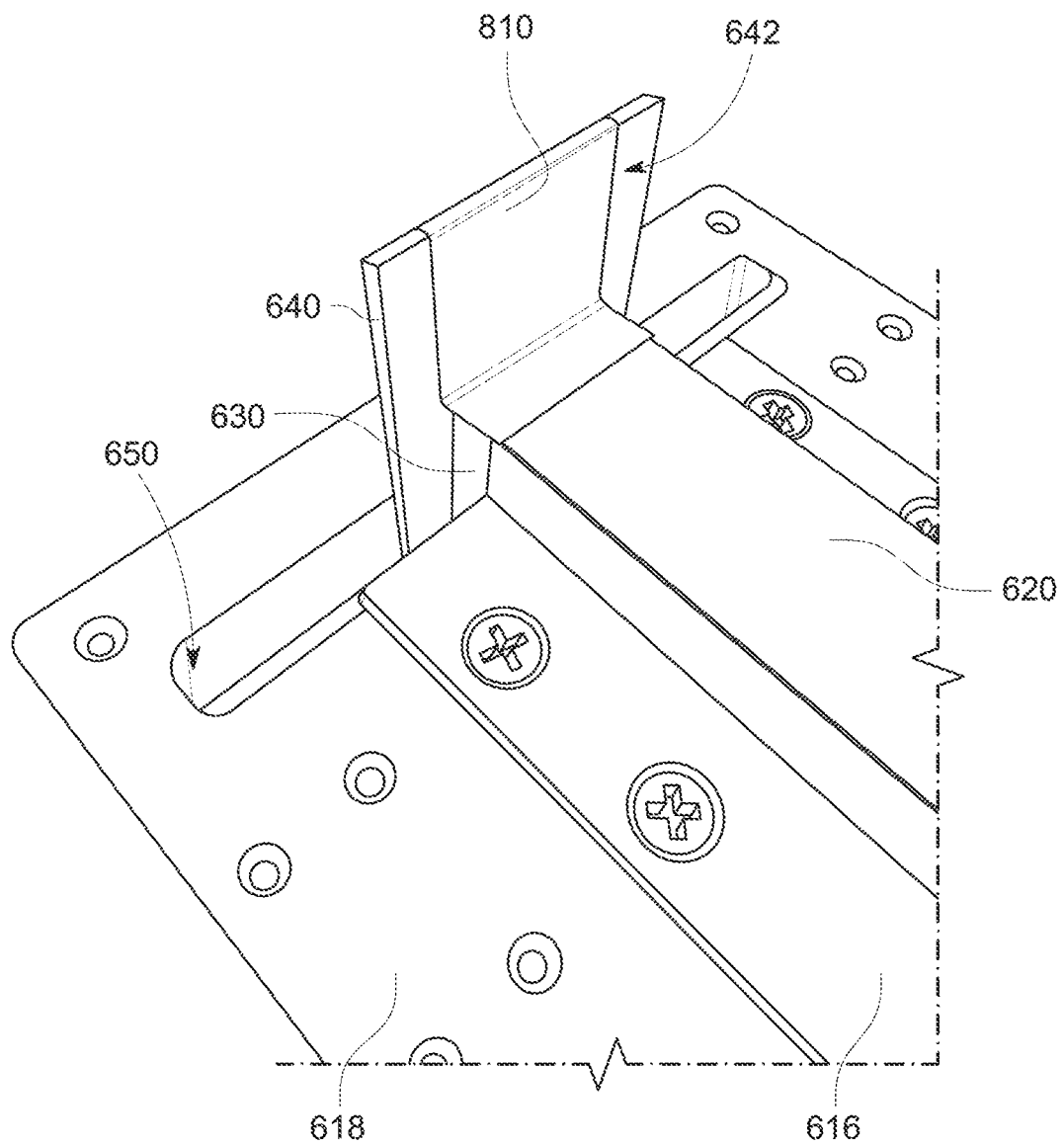
FIG. 8 is a perspective view of the assembly of FIG. 6A illustrating the use of a thin film on the notch formation pieces.

FIG. 8 is a perspective view of the assembly of FIG. 6A illustrating the use of a thin film on the notch formation pieces. The thin film 810 is disposed on at least the surfaces of the notch edge formation piece 630 and the notch end formation piece 640 which may come into contact with the laminate 620 being formed. The thin film or lining 810 is made of a plastic lining material that prevents the laminate 620 such as ice from adhering to the notch edge formation piece 630 and from adhering to the notch end formation piece 640. The lining material may be a plastic material and can be held in place with grease. An example is a silicone grease that may be applied using a cotton applicator. The thickness of the lining 810 is substantially smaller than the thickness of the notch edge formation piece 630 and may be about 0.02-0.05 mm.

The process of forming the polycrystalline laminate 620 on the substrate 616 may be similar to that shown in FIG. 4. In addition, the step 402 of preparing the substrate 616 further includes attaching the notch edge formation piece 630 and the notch end formation piece 640 to the backplate 618 of the sample holder and applying the thin film lining 810 onto the notch edge formation piece 630 and the notch end formation piece 640. The step 406 further includes controlling the temperature of the notch edge formation piece 603 along with the temperature of the substrate 616. The step 410 further includes seeding the edge of the notch edge formation piece 630 in preparation for polycrystalline laminate growth. The step 412 further includes lowering the edge of the notch edge formation piece 630 in contact with the liquid surface of the reservoir and retracting to grow the polycrystalline laminate on the edge of the notch edge formation piece 630 as well as the substrate surface 617. The step 414 further includes controlling the temperature of the notch edge formation piece 630 as well as the substrate 616 during retraction from the liquid surface of the reservoir. The step 416 further includes raising the edge of the notch edge formation piece 630 fully away from the liquid surface of the reservoir.

Figure 9:
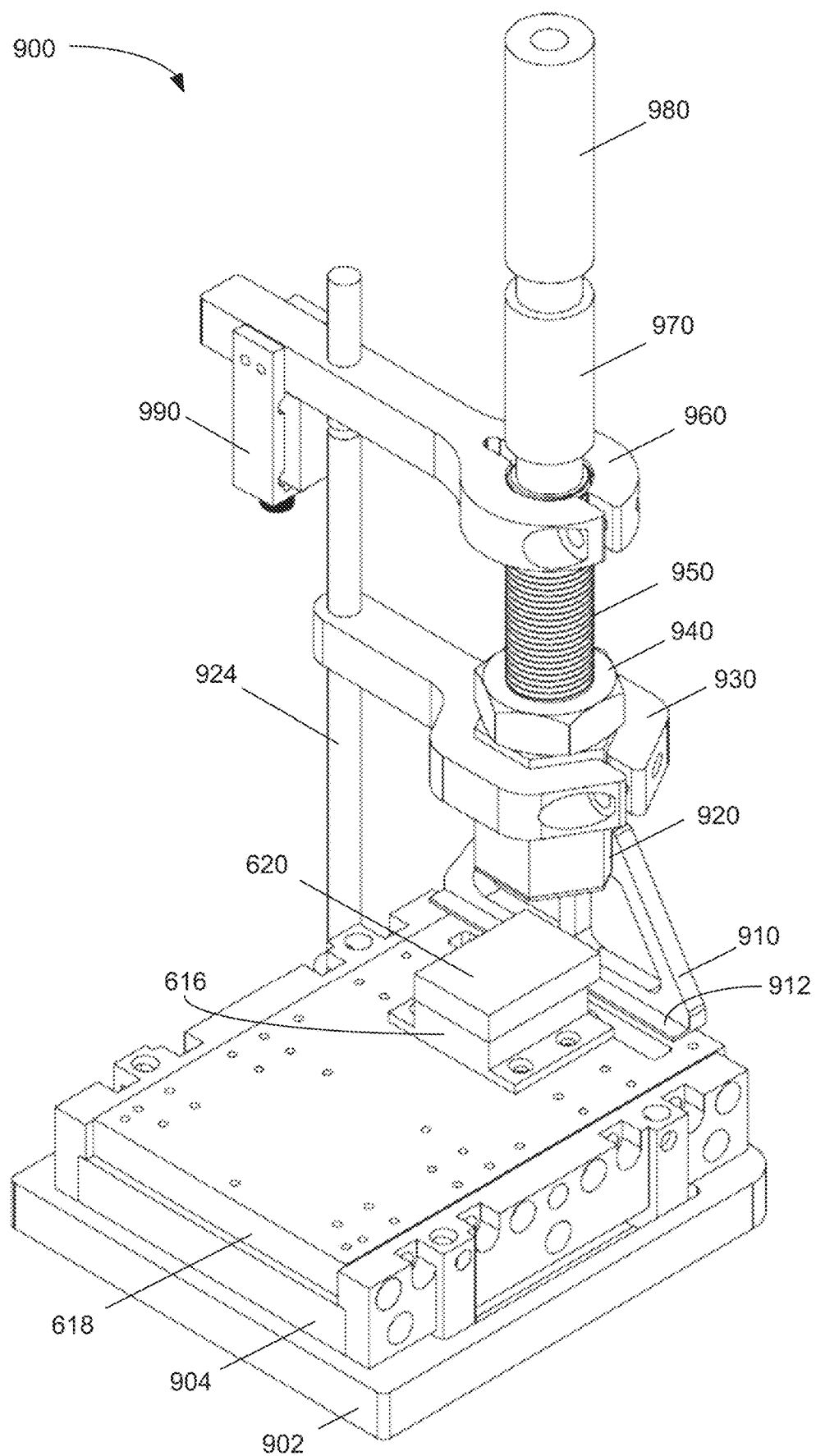
FIG. 9 is a perspective view of an adhesion testing apparatus to perform adhesion testing by tensile cleavage on the polycrystalline laminate with the notch formed using the assembly of FIG. 6A.
Figure 10:
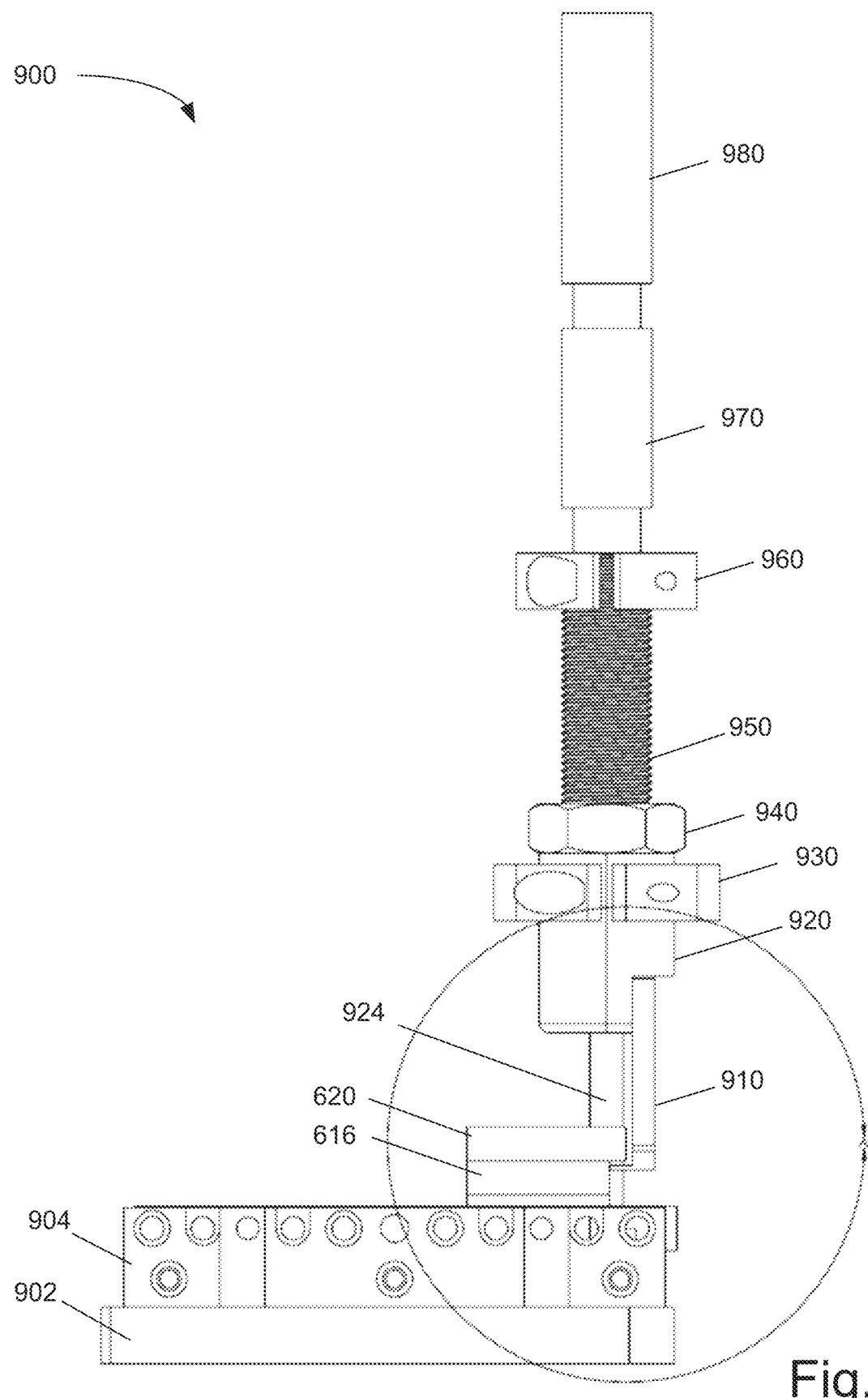
FIG. 10 is a side elevational view of the adhesion testing apparatus by tensile cleavage of FIG. 9.
Figure 11:
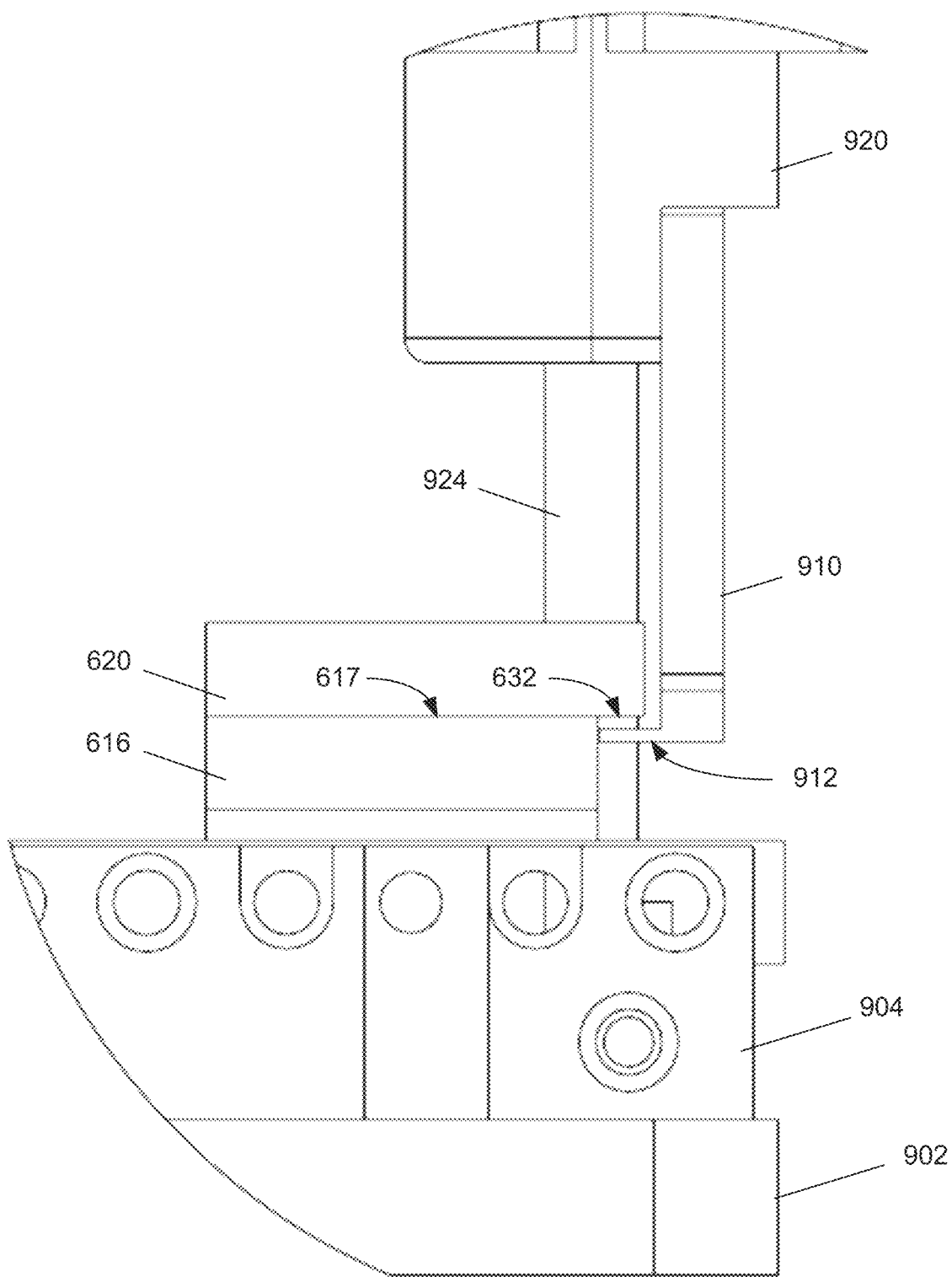
FIG. 11 is a close-up view of detail A in FIG. 10.

FIG. 9 is a perspective view of an adhesion testing apparatus to perform adhesion testing by tensile cleavage on the polycrystalline laminate with the notch formed using the assembly of FIG. 6A. FIG. 10 is a side elevational view thereof. FIG. 11 is a close-up view of detail A in FIG. 10.

The adhesion testing apparatus 900 includes a base 902 on which a sample holder 904 is disposed. The sample holder 904 supports the backplate 618 on which the substrate 616 is mounted. The notched laminate 620 is disposed on the substrate 616. The notch edge formation piece 630 and the notch end formation piece 640 are removed before placing the backplate 618 into the sample holder 904. The sample holder 904, backplate 618, substrate 616, and laminate 620 may be oriented generally horizontally.

A tensile load head 910 has a lip 912 for engaging the notch 632 to apply a tensile cleavage force on the notched laminate 620 by moving vertically upward. The tensile load head 910 may be made of stainless steel. It is attached to a load head adapter or mount 920 which is connected to a support shaft or pole 924 by a stabilizer or brace 930 that stabilizes the load head adapter 920 to move in the vertical direction without rotational motion. The load head adapter 920 is connected to a threaded coupler 950 and the load head adapter 920 is locked with a locknut 940 which may be a counter-lock nut. The brace 930 may have a set screw locking it to the load head adapter 920 so that it slides along the shaft 924 during loading. Another brace 960 connects the threaded coupler 950 to the support pole 924 to provide mounting capability for displacement sensors (e.g., extensometer, LVDT). An optional load cell 970 connects the threaded coupler 950 to an optional loading piston 980 configured to be coupled to a drive member. In one example, the loading piston 980 has a threaded portion which is compatible with a standard mechanical property testing system for making a threaded connection to a drive member of that system. An extensometer or LVDT or the like 990 is attached to the brace 960 to measure displacement in the vertical direction. By use of an LVDT or extensometer 990 on the electromechanical testing system, the adhesive properties can be determined from the load, displacement, and time data.

The lip 912 of the tensile load head 910 makes contact with the notch 632 of the laminate 620. The electromechanical testing system is actuated to move the tensile load head 910 away from the substrate 616, causing tensile cleavage between the laminate 620 and the substrate 616 in the vertical direction generally perpendicular to the planar contact between the laminate 620 and the substrate surface 617 of the substrate 616.

Figure 12:
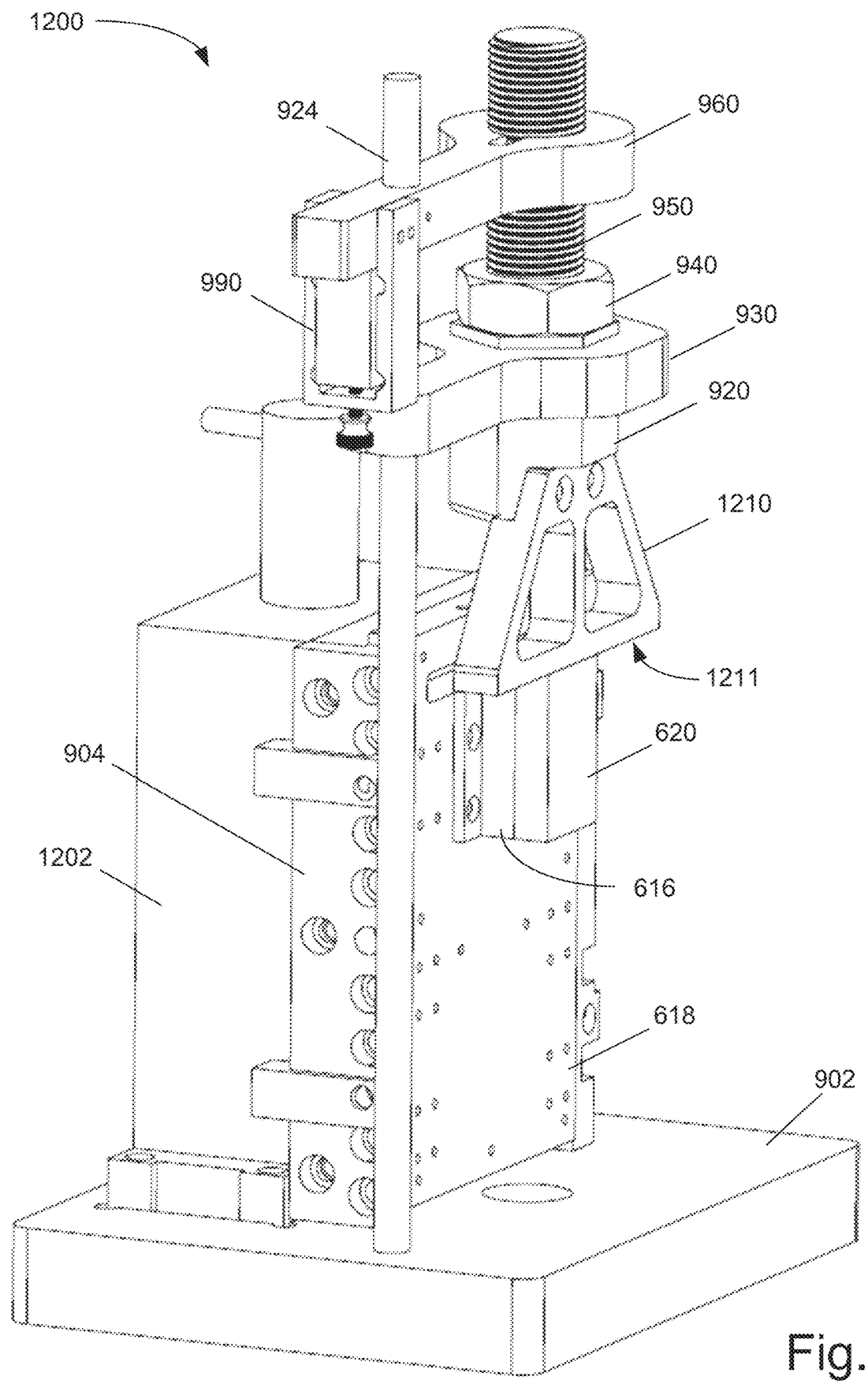
FIG. 12 is a perspective view of an adhesion testing apparatus to perform adhesion testing by shear sliding on the polycrystalline laminate with the notch formed using the assembly of FIG. 6A according to another embodiment of the invention.
Figure 13:
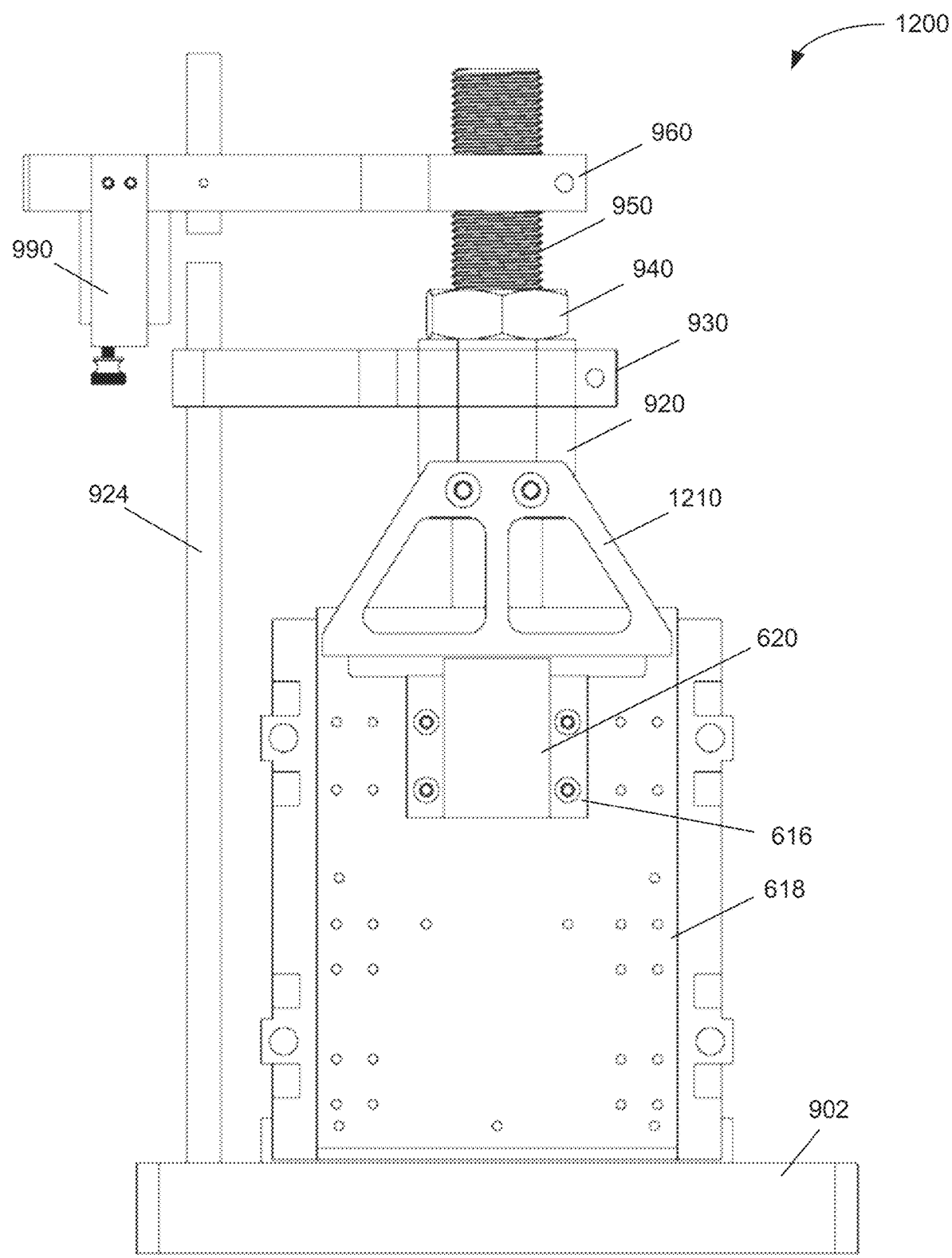
FIG. 13 is a front elevational view of the adhesion testing apparatus by shear sliding of FIG. 12.
Figure 14:
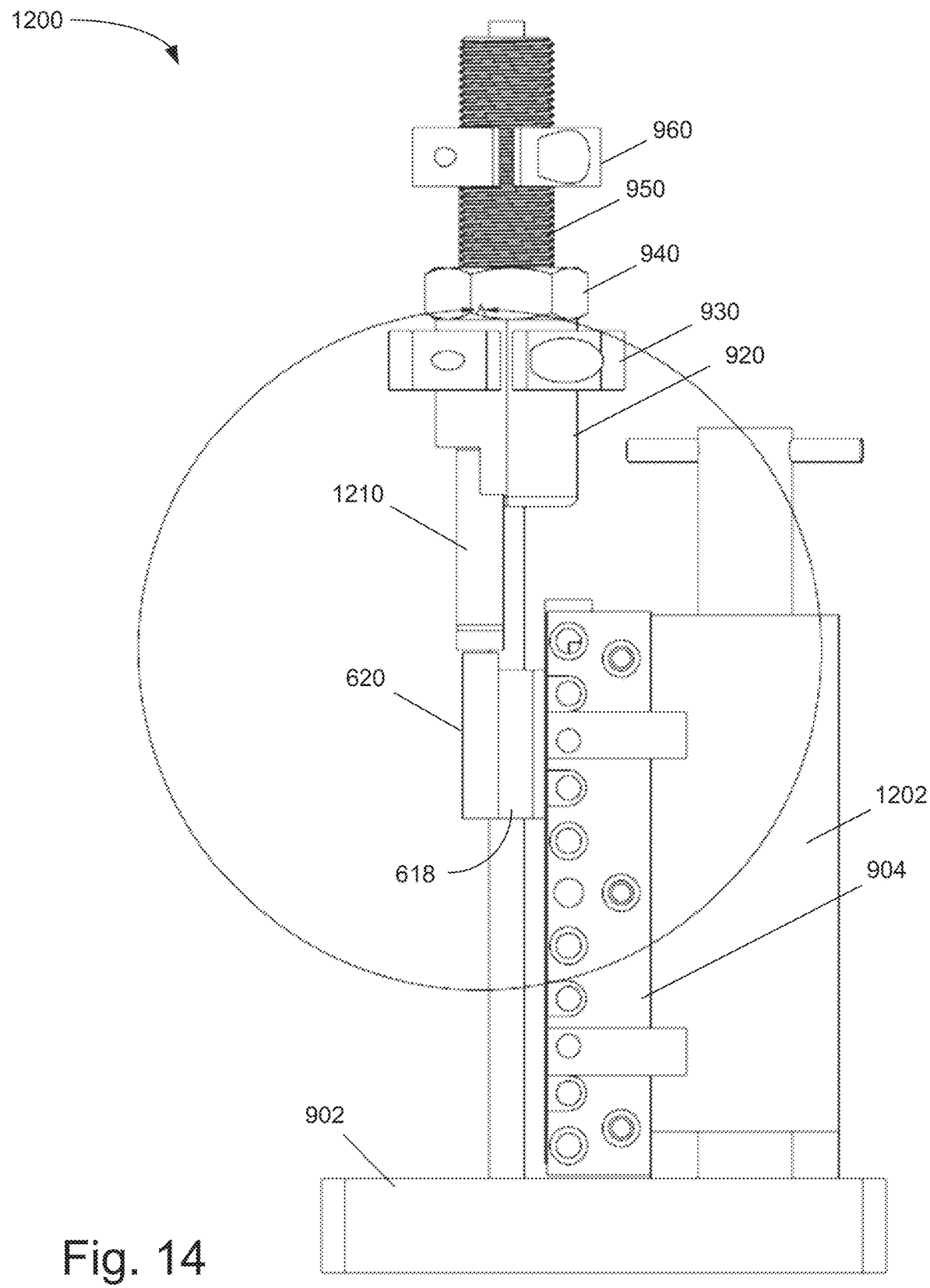
FIG. 14 is a side elevational view of the adhesion testing apparatus by shear sliding of FIG. 12.
Figure 15:
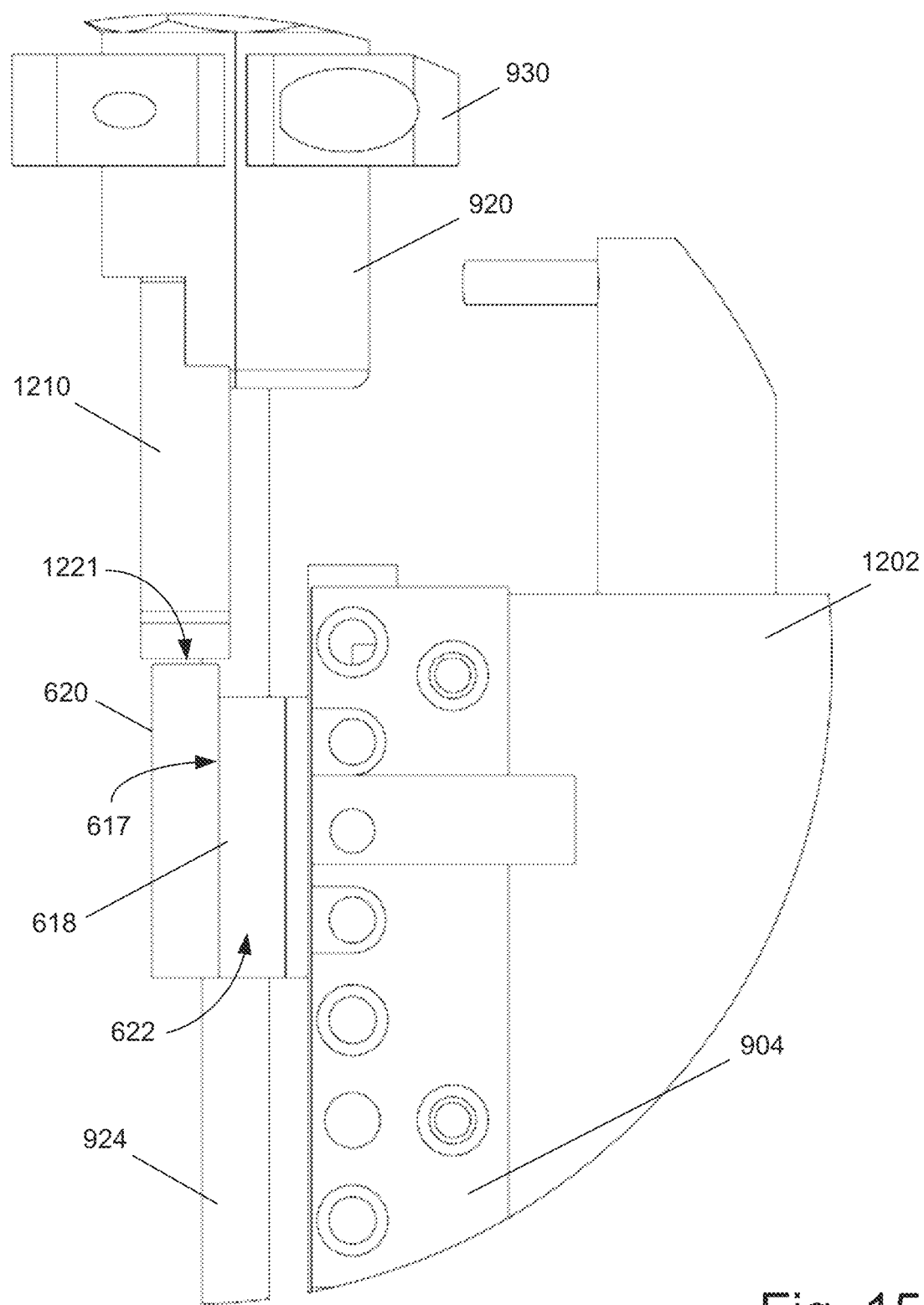
FIG. 15 is a close-up view of detail A in FIG. 14.

FIG. 12 is a perspective view of an adhesion testing apparatus to perform adhesion testing by shear sliding on the polycrystalline laminate with the notch formed using the assembly of FIG. 6A according to another embodiment of the invention. FIG. 13 is a front elevational view thereof. FIG. 14 is a side elevational view thereof. FIG. 15 is a close-up view of detail A in FIG. 14.

The adhesion apparatus 1200 configured for shear testing may be similar to the adhesion apparatus 900 configured for tensile testing. Main differences include the manner in which the test sample is mounted and the way loading is applied. The sample holder 904, backplate 618, substrate 616, and laminate 620 may be oriented generally vertically, being mounted to a vertical support 1202 attached to the base 902. A leading end 1211 of the shear load head 1210 is actuated by the electromechanical testing system to make contact with an end 1221 of the laminate 620 and push the laminate 620 in a direction generally parallel to the substrate length edge 622 of the substrate 616 on which the laminate 620 makes planar contact with the substrate surface 1617 of the substrate 616 (downward in FIGS. 12-15), causing shear sliding of the laminate 620 relative to the substrate surface 617 of the substrate 616.

The adhesion testing apparatus 900, 1200 can be mounted on any electromechanical load frame for application of a load to measure the adhesive properties of the materials of interest. In the embodiments shown, the electromechanical load system applies the load using two load heads: one for tensile loading and the other for shear loading. As such, the system can be configured for testing adhesion via tensile cleavage or shear sliding. By use of the LVDT or extensometer on the electromechanical testing system, the adhesive properties can be determined from the load, displacement, and time data.

The testing system enables the measurement of adhesive properties of solid and brittle adhesives to metals, ceramics, polymer, and a wide range of coated substrates. It enables the measurement of the adhesive properties of brittle, solid, and otherwise crystalline adhesives such as ice, paraffin, and fatty acids. There is very little restriction on the height of the bonded assembly or adhesion assembly of the laminate and substrate or the like. Because this apparatus can be configured for interfacial cleavage in both shear sliding and tensile peel geometries, the performance of adhesives and interfaces under different loading conditions can be probed.

Figure 16:
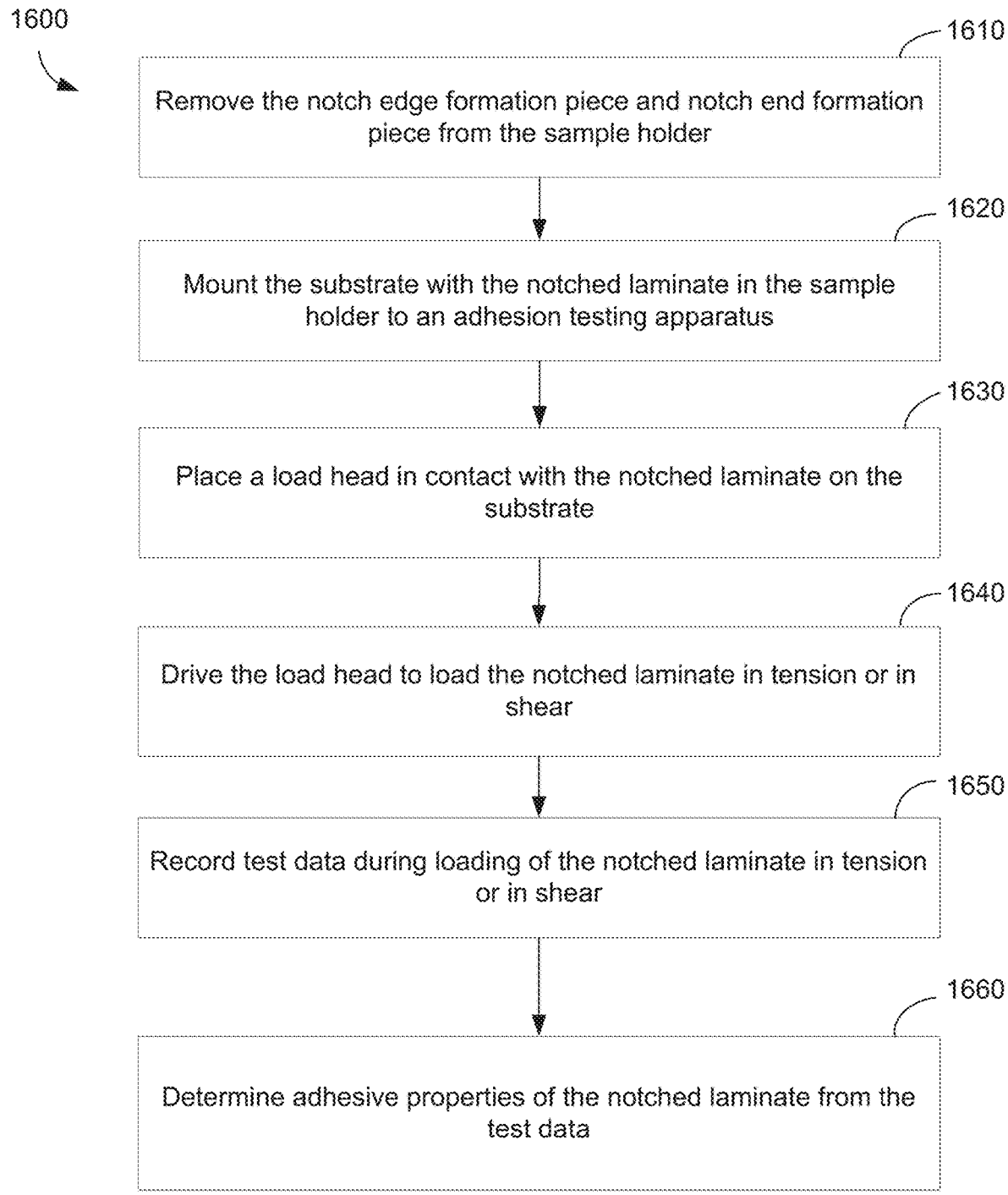
FIG. 16 is a flow diagram of the adhesion testing process according to an embodiment of the present invention.

FIG. 16 is a flow diagram 1600 of the adhesion testing process according to an embodiment of the present invention. In step 1610, the notch edge formation piece 630 and the notch end formation piece 640 are removed from the sample holder 904. In step 1620, the sample holder 904, backplate 618, substrate 616, and notched laminate 620 are mounted to the adhesion testing apparatus 900. In step 1620, the sample holder 904 is oriented for tensile cleavage testing (e.g., horizontally in FIGS. 9-11) or shear sliding testing (e.g., vertically in FIGS. 12-15). In step 1630, a load head is placed in negligible contact with the laminate 620 for tensile loading (e.g., the lip 912 of the tensile load head 910 in contact with the notch 632 of the laminate 620) or shear loading (e.g., the leading end 1211 of the shear load head 1210 in contact with the end 1221 of the laminate 620). In step 1640, the load head is driven or actuated to load the laminate for testing in tension (e.g., moving the tensile load head 910 in a direction generally perpendicular to the substrate surface 617 away from the substrate surface 617) or in shear (e.g., moving the shear load head 1210 in a direction generally parallel to the substrate length edge 622). In step 1650, the test data is recorded including load, displacement, time, and the like (e.g., using the LVDT or extensometer 990 on the electromechanical testing system). In step 1660, the adhesive properties of the laminate 620 can be determined or calculated from the load, displacement, and time data.

In the above examples, a single bi-material interface is studied (i.e., between the substrate and the polycrystalline laminate). In other examples, dual bi-material (sandwich-like) configurations can be used to test adhesives, as described hereinbelow.

Figure 17:
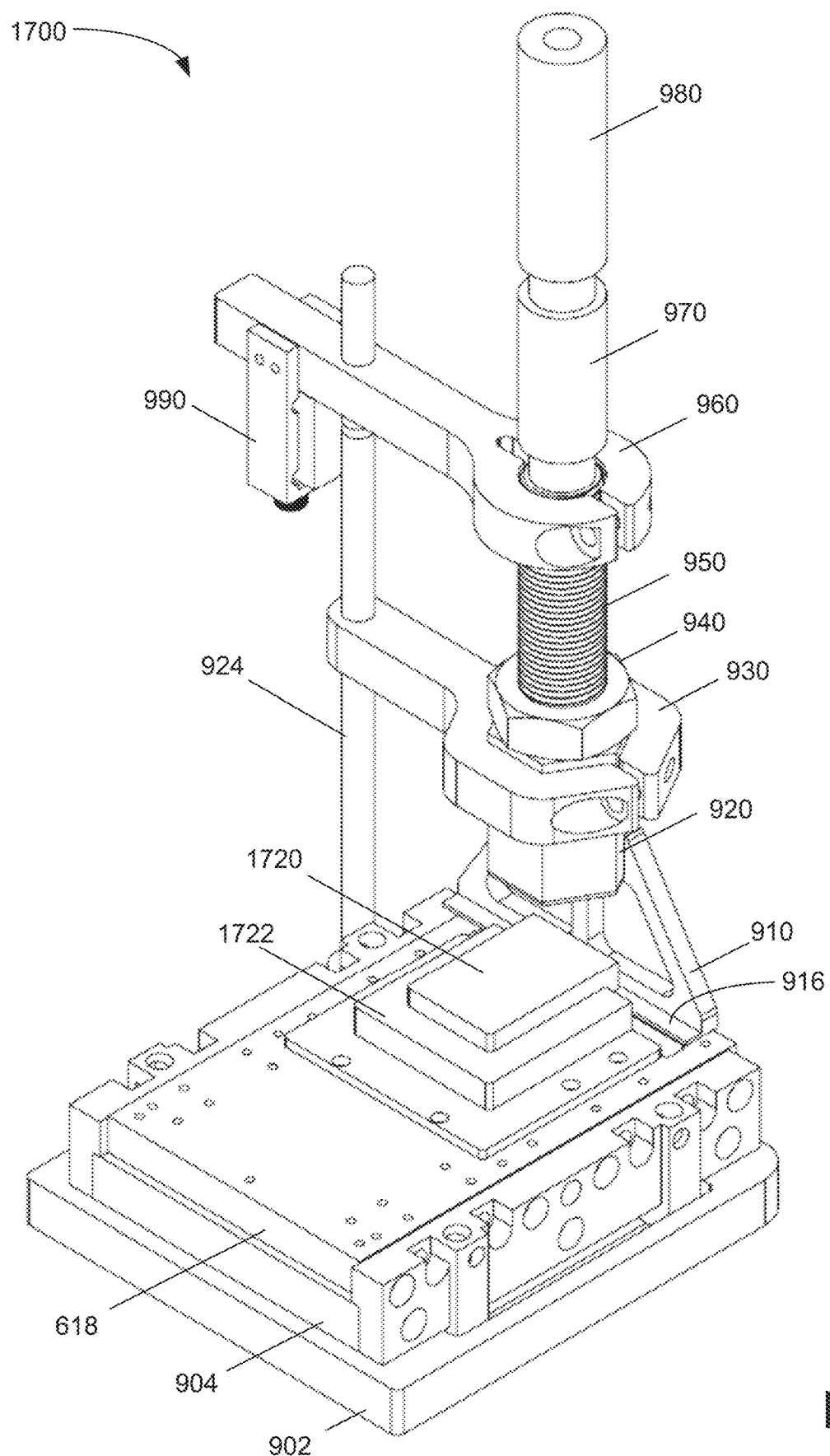
FIG. 17 is a perspective view of an adhesion testing apparatus to perform adhesion testing by tensile cleavage on a sandwiched adhesive structure with a notch according to another embodiment of the invention.
Figure 18:
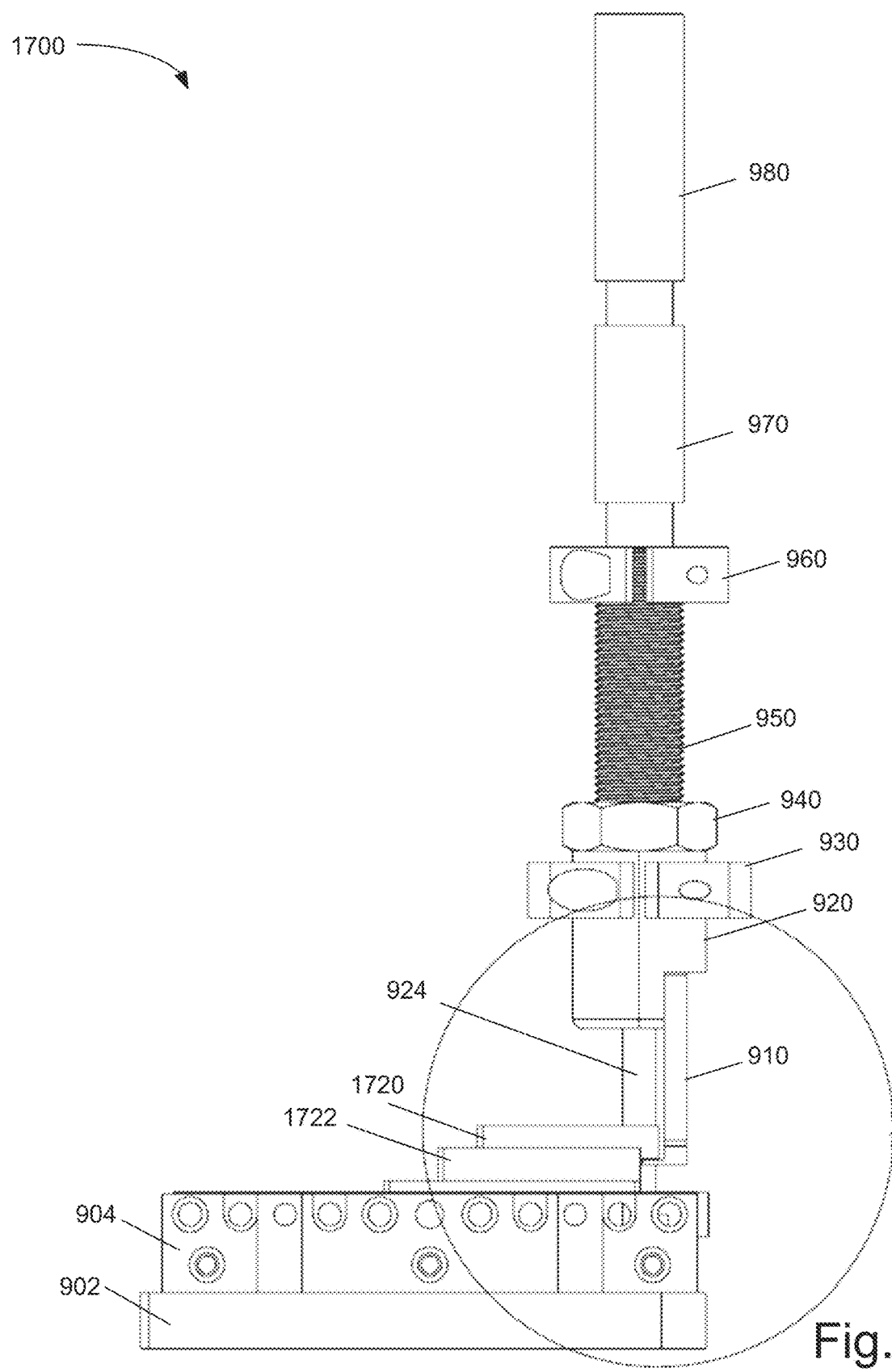
FIG. 18 is a side elevational view of the adhesion testing apparatus by tensile cleavage of FIG. 17.
Figure 19:
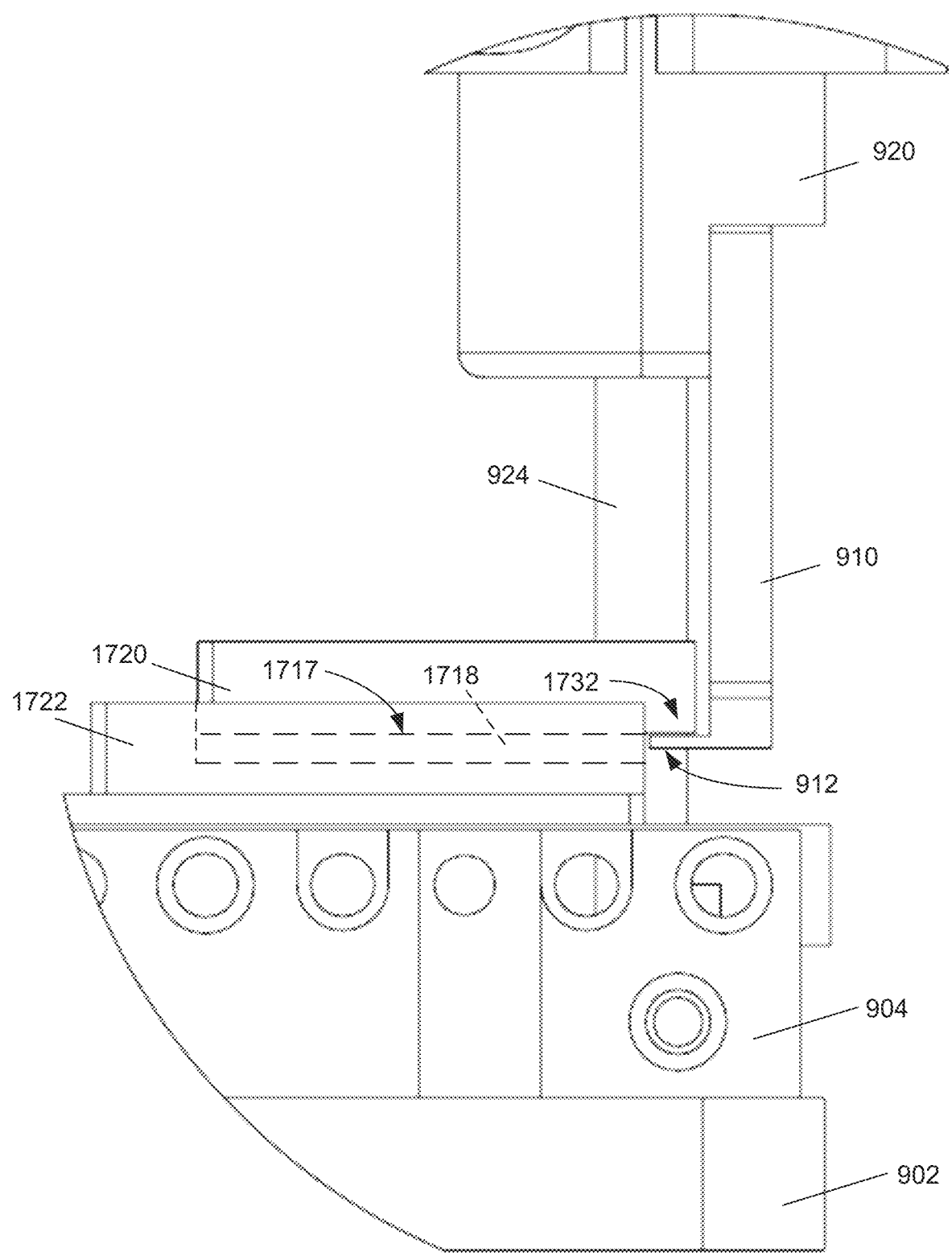
FIG. 19 is a close-up view of detail A in FIG. 18.

FIG. 17 is a perspective view of an adhesion testing apparatus to perform adhesion testing by tensile cleavage on a sandwiched adhesive structure with a notch according to another embodiment of the invention. FIG. 18 is a side elevational view thereof. FIG. 19 is a close-up view of detail A in FIG. 18.

Instead of a notched laminate on a substrate, the sandwiched adhesive structure includes a specimen or sample 1720 adhered by a planar adhesive layer 1717 therebetween to another specimen or sample 1718 which is securely mounted to the backplate 618 with a bracket 1722. The bracket 1722 is mounted to the backplate 618. The sample 1720 has an overhang 1732 that overhangs a bracket width edge of the bracket 1722 similar to the manner in which the notch 632 of the notched laminate 620 extends beyond the substrate width edge 624 of the substrate surface 617.

The adhesion testing apparatus 1700 may be substantially the same as the adhesion testing apparatus 900. It includes the base 902 on which the sample holder 904 is disposed. The sample holder 904 supports the backplate 618 on which the bracket 1722 is mounted. The upper sample 1720 is disposed on and adhered to the lower sample 1718 mounted on the bracket 1722 via the planar adhesive layer 1717. The sample holder 904, backplate 618, bracket 1722, and sample 1720 may be oriented generally horizontally.

The tensile load head 910 has the lip 912 for engaging the sample overhang 1732 to apply a tensile cleavage force by moving vertically upward. The lip 912 of the tensile load head 910 makes contact with the sample overhang 1732 of the sample 1720. The electromechanical testing system is actuated to move the tensile load head 910 away from the bracket 1722, causing tensile cleavage between the sample 1720 and the bracket 1722 in the vertical direction generally perpendicular to the planar adhesive layer 1717 between the upper sample 1720 and the lower sample 1718 securely mounted on planar bracket surface of the bracket 1722.

Figure 20:
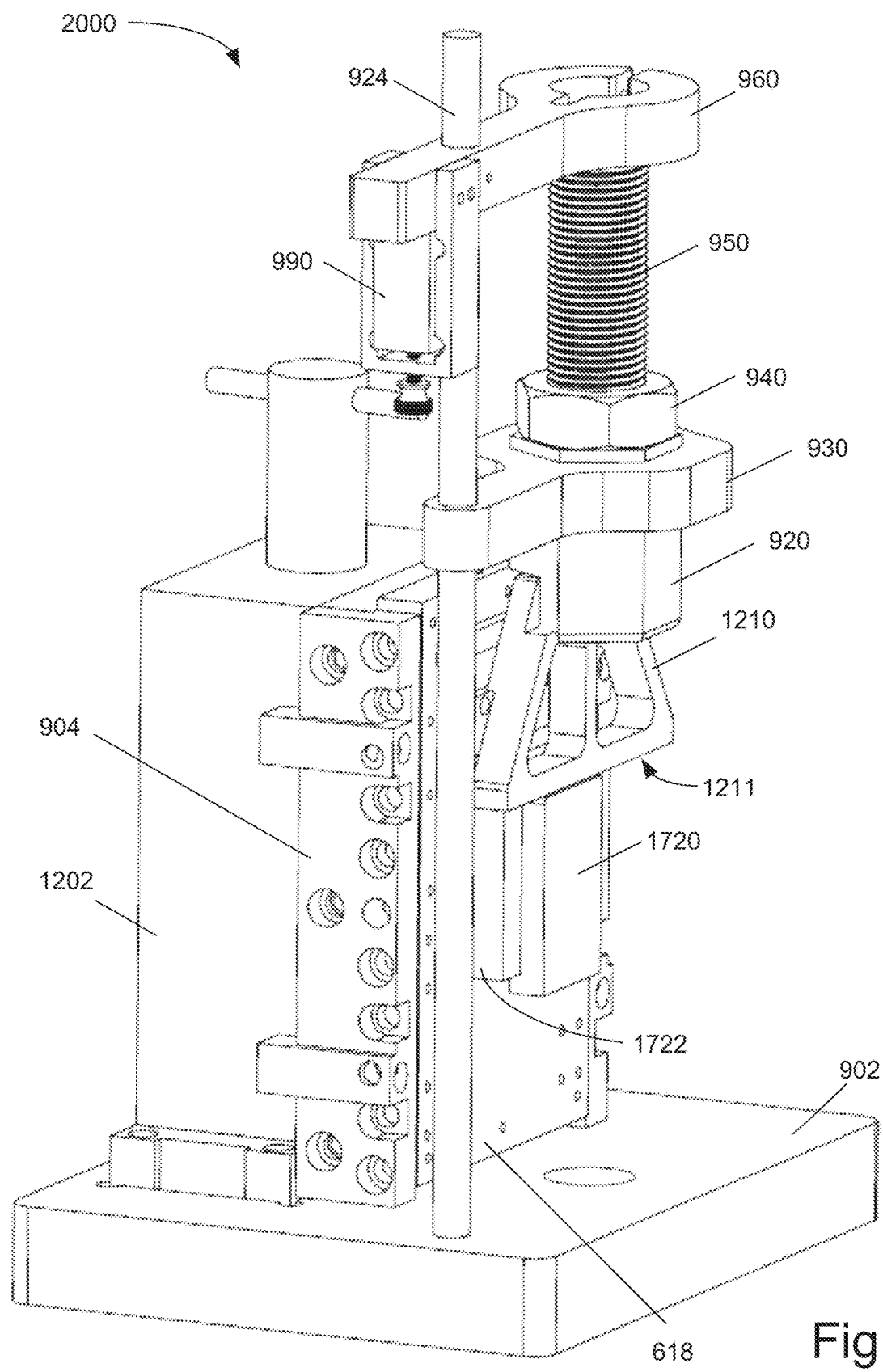
FIG. 20 is a perspective view of an adhesion testing apparatus to perform adhesion testing by shear sliding on a sandwiched adhesive structure with a notch according to another embodiment of the invention.
Figure 21:
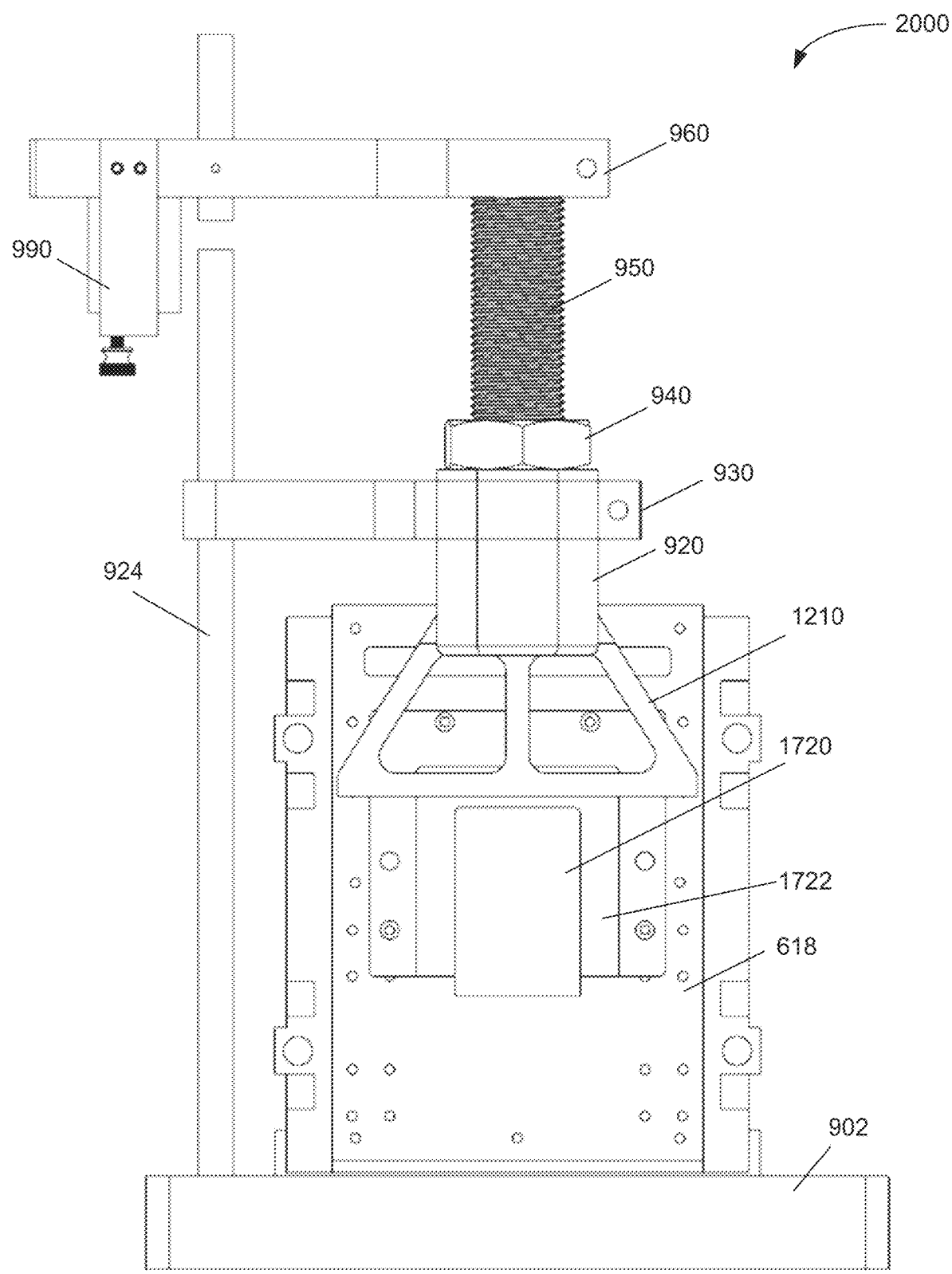
FIG. 21 is a front elevational view of the adhesion testing apparatus by shear sliding of FIG. 20.
Figure 22:
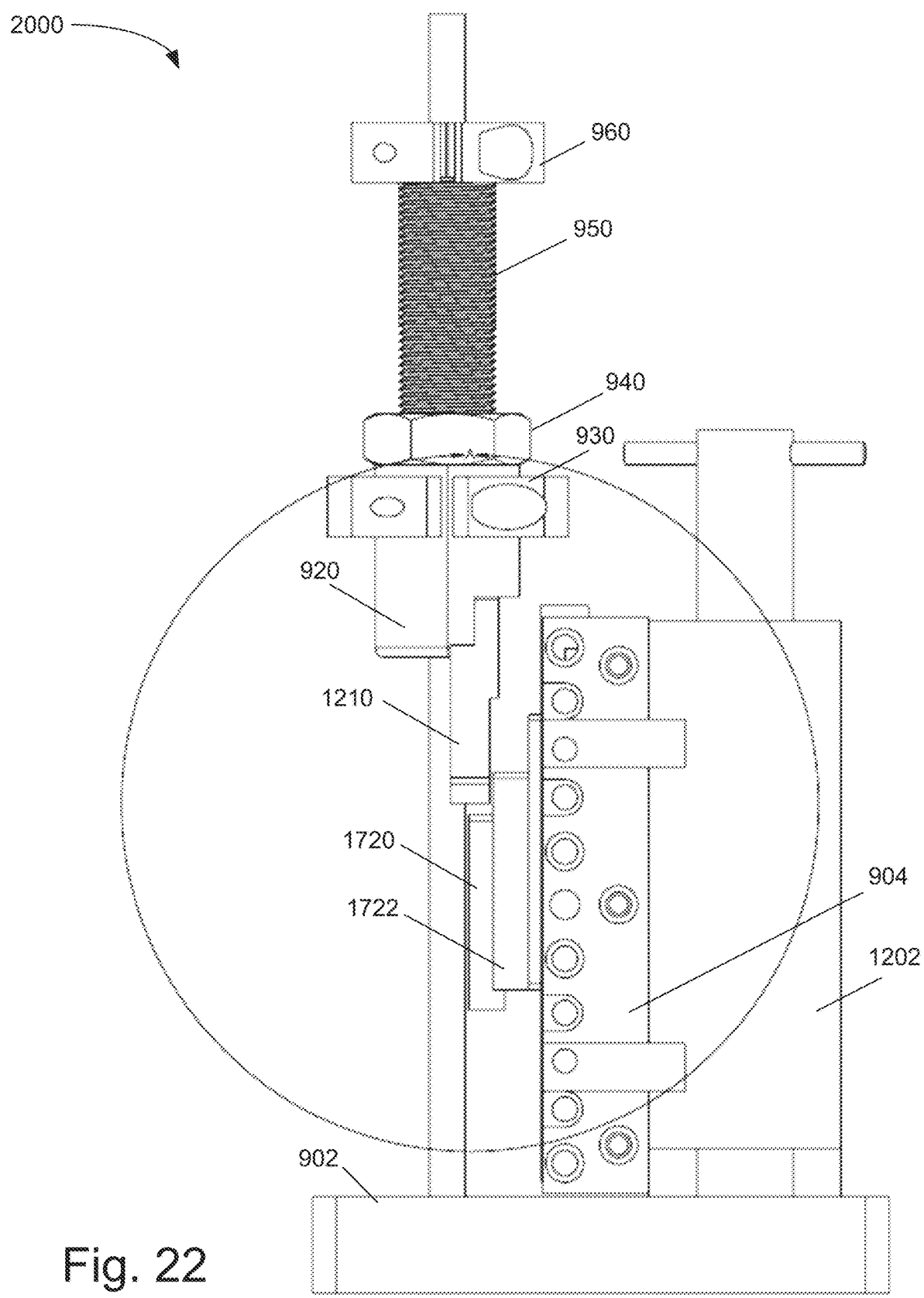
FIG. 22 is a side elevational view of the adhesion testing apparatus by shear sliding of FIG. 20.
Figure 23:
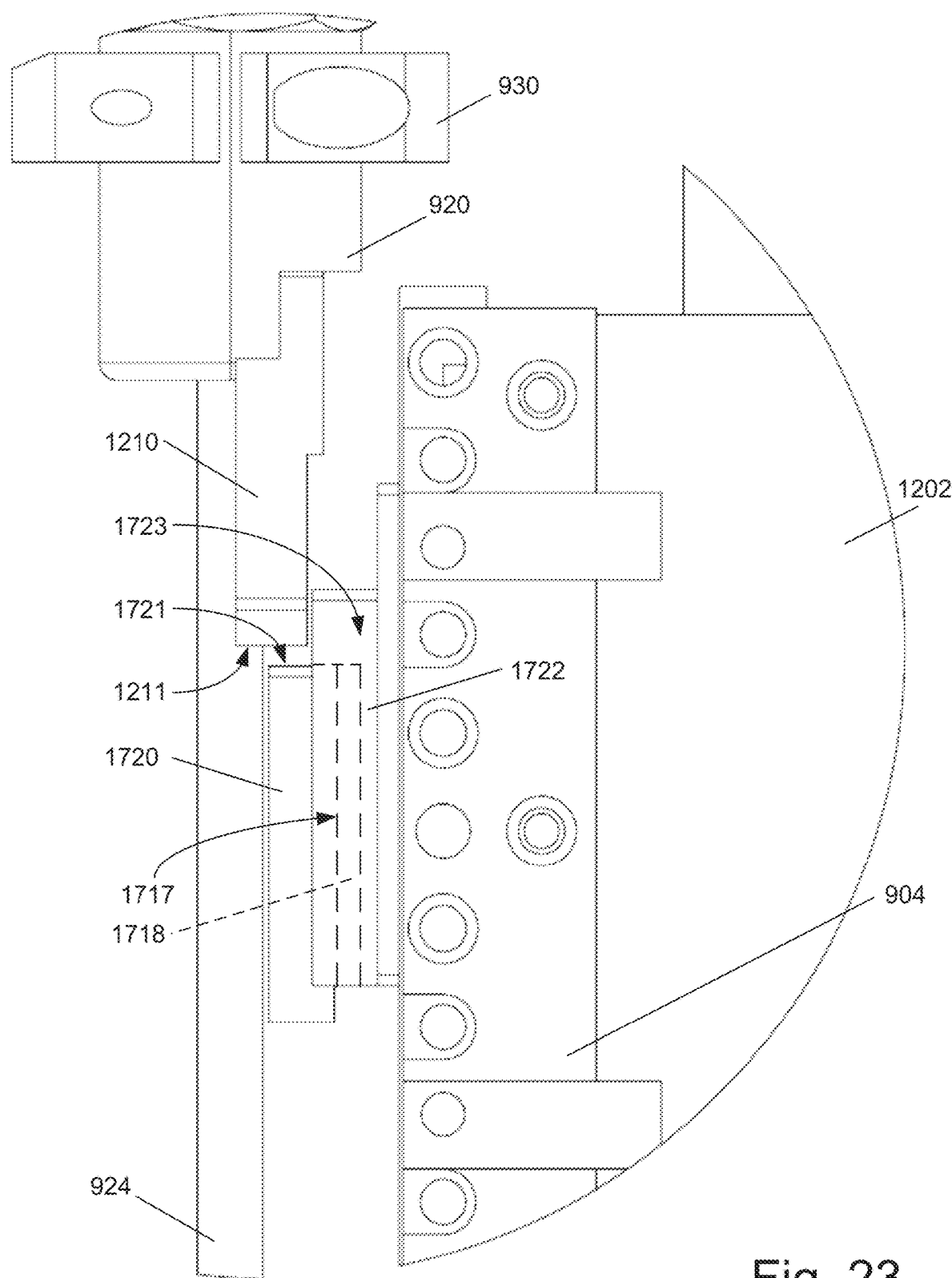
FIG. 23 is a close-up view of detail A in FIG. 22.

FIG. 20 is a perspective view of an adhesion testing apparatus to perform adhesion testing by shear sliding on a sandwiched adhesive structure with a notch according to another embodiment of the invention. FIG. 21 is a front elevational view thereof. FIG. 22 is a side elevational view thereof. FIG. 23 is a close-up view of detail A in FIG. 22.

The adhesion testing apparatus 2000 configured for shear testing may be similar to the adhesion apparatus 1700 configured for tensile testing. Main differences include the manner in which the test sample is mounted and the way loading is applied. Again, instead of a notched laminate on a substrate, the sandwiched adhesive structure includes the upper sample 1720 adhered to the lower sample 1718 which is secured within the bracket 1722, by the planar adhesive layer 1717 therebetween. The bracket 1722 is mounted to the backplate 618. The sample 1720 has the overhang 1732 that overhangs the bracket width edge of the bracket 1722.

The sample holder 904, backplate 618, bracket 1722, and sample 1720 may be oriented generally vertically. The leading end 1211 of the shear load head 1210 is actuated by the electromechanical testing system to make contact with an end 1721 of the sample 1720 and push the sample 1720 in a direction generally parallel to a bracket length edge 1723 of the bracket 1722 on which the upper sample 1720 makes planar contact with the lower sample 1718 held by the bracket 1722, via the planar adhesive layer 1717 between the samples 1720, 1718 (downward in FIGS. 20-23), causing shear sliding of the sample 1720 relative to the planar bracket surface of the bracket 1722.

This apparatus can be used to carry out methods ASTM D5868-01 and/or ASTM D3807-98 to test the strength of adhesives to fiber reinforced plastic materials or engineering plastics, respectively. It can be used to test the strength of adhesives to bond mineral, ceramic, or geomaterials, such as limestone and granite.

As will be appreciated by one of ordinary skill in the art, the present invention may be embodied as an apparatus (including, for example, a system, a machine, a device, and/or the like), as a method (including, for example, a business process, and/or the like), as a computer-readable storage medium, or as any combination of the foregoing.

Embodiments of the invention can be manifest in the form of methods and apparatuses for practicing those methods.

Unless explicitly stated otherwise, each numerical value and range should be interpreted as being approximate as if the word "about" or "approximately" preceded the value or range.

Unless otherwise indicated, all numbers expressing quantities of ingredients, properties such as molecular weight, percent, ratio, reaction conditions, and so forth used in the specification and claims are to be understood as being modified in all instances by the term "about," whether or not the term "about" is present. Accordingly, unless indicated to the contrary, the numerical parameters set forth in the specification and claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

All documents mentioned herein are hereby incorporated by reference in their entirety or alternatively to provide the disclosure for which they were specifically relied upon.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A method of forming and testing a polycrystalline laminate on a substrate surface of a substrate, the substrate surface including a substrate length edge having a substrate length and a substrate width edge having a substrate width, the polycrystalline laminate to be formed on an edge of a notch edge formation piece disposed adjacent the substrate surface at the substrate width edge thereof, the edge of the notch edge formation piece being flush with the substrate surface and having an edge width at least equal to the substrate width and having a thickness which is substantially smaller than the substrate width of the substrate width edge, the polycrystalline laminate to be formed to have a laminate width edge against a planar surface of a notch end formation piece disposed adjacent the notch edge formation piece, the planar surface of the notch end formation piece extending in a width direction at least along the edge width of the edge of the notch edge formation piece and extending in a height direction beyond the substrate surface and the edge of the notch edge formation piece to define a location for the laminate width edge, the method comprising:
mounting the substrate, the notch edge formation piece, and the notch end formation piece to a sample holder with the substrate surface and the edge of the notch edge formation piece flush with one another and facing a liquid surface of a reservoir disposed in a chamber that provides an ambient temperature;
seeding the substrate surface and the edge of the notch edge formation piece with seed droplets;
lowering the substrate surface, the edge of the notch edge formation piece, and the notch end formation piece to the liquid surface of the reservoir;
independently controlling a temperature of the substrate and the notch edge formation piece and a temperature of the reservoir to produce a temperature difference over a period of time for crystallization growth; and
retracting the substrate surface and the edge of the notch edge formation piece from the liquid surface of the reservoir at a draw rate;
the draw rate and the temperature difference being selected to grow polycrystalline laminate on the substrate surface and the edge of the notch edge formation piece.

2. The method of claim 1, wherein the temperature of the substrate is controlled by undercooling the sample holder to an initial temperature that is lower than the liquid surface temperature for an initial period of time, ramping the temperature of the substrate and the notch edge formation piece from the initial temperature to a final temperature that is lower than the initial temperature for a ramp period of time, and holding the temperature of the substrate and the notch edge formation piece at the final temperature for a final period of time.

3. The method of claim 1,
wherein the notch edge formation piece and the substrate have approximately a same thermal conductivity and the notch end formation piece has a different thermal conductivity which is substantially lower than the thermal conductivity of the substrate.

4. The method of claim 1,
wherein the polycrystalline laminate is polycrystalline ice laminate and wherein the draw rate is a fixed rate selected to closely match a velocity of a freezing front of ice growth on the substrate surface and the edge of the notch edge formation piece.

5. The method of claim 1, further comprising, prior to lowering the substrate surface, the edge of the notch edge formation piece, and the notch end formation piece to the liquid surface of the reservoir:
applying a lining material on the notch edge formation piece and the notch end formation piece to prevent the polycrystalline laminate from adhering to the notch edge formation piece and from adhering to the notch end formation piece.

6. The method of claim 1, further comprising:
removing the notch edge formation piece and the notch end formation piece from the sample holder to expose a notch of the polycrystalline laminate extending beyond the substrate width edge of the substrate surface; and
applying a load on the notch of the polycrystalline laminate in a direction generally perpendicular to the substrate surface and away from the substrate surface.

7. The method of claim 1, further comprising:
removing the notch edge formation piece and the notch end formation piece from the sample holder to expose a notch of the polycrystalline laminate extending beyond the substrate width edge of the substrate surface; and
applying a load on the polycrystalline laminate in a length direction generally parallel to the substrate length edge of the substrate surface.

8. A system of forming and testing a polycrystalline laminate, the apparatus comprising:
a substrate including a substrate surface on which to form the polycrystalline laminate, the substrate surface including a substrate length edge having a substrate length and a substrate width edge having a substrate width;
a notch edge formation piece having an edge on which to form the polycrystalline laminate, the edge of the notch edge formation piece disposed adjacent the substrate surface at the substrate width edge, the edge of the notch edge formation piece being flush with the substrate surface and having an edge width at least equal to the substrate width and having a thickness which is substantially smaller than the substrate width of the substrate width edge;
a notch end formation piece disposed adjacent the notch edge formation piece and having a planar surface which extends in a width direction at least along the edge width of the edge of the notch edge formation piece and extends in a height direction beyond the substrate surface and the edge of the notch edge formation piece, the polycrystalline laminate to be formed to have a laminate width edge against the planar surface of the notch end formation piece; and
a sample holder to mount the substrate, the notch edge formation piece, and the notch end formation piece for forming the polycrystalline laminate on the substrate and the edge of the notch edge formation piece with the laminate width edge against the planar surface of the notch end formation piece, the notch edge formation piece and the notch end formation piece being removable from the sample holder for testing to expose a notch of the polycrystalline laminate extending beyond the substrate width edge of the substrate surface;

the notch edge formation piece and the substrate having approximately a same thermal conductivity and the notch end formation piece having a different thermal conductivity which is substantially lower than the thermal conductivity of the substrate.

9. The system of claim 8,
wherein the substrate and the notch edge formation piece are made of metal and the notch end formation piece is made of plastic.

10. The system of claim 8, further comprising:
a lining material applied on the notch edge formation piece and the notch end formation piece to prevent the polycrystalline laminate from adhering to the notch edge formation piece and from adhering to the notch end formation piece, the lining material having a thickness which is substantially smaller than the thickness of the notch edge formation piece.

11. The system of claim 8, further comprising:
a frame disposed in a chamber that provides an ambient temperature;
a container having a reservoir therein, the sample holder being disposed to mount the substrate and the notch edge formation piece above the reservoir with the substrate surface and the edge of the notch edge formation piece facing a liquid surface of the reservoir;
a sample holder temperature control device to control a temperature of the sample holder;
a reservoir temperature control device to control a temperature of the reservoir independently of the temperature of the sample holder to produce a temperature difference over a period of time for crystallization growth; and
a linear stage to lower the substrate surface and the edge of the notch edge formation piece and the notch end formation piece to the liquid surface of the reservoir and to retract the substrate surface and the edge of the notch edge formation piece and the notch end formation piece from the liquid surface of the reservoir at a draw rate;
wherein the draw rate and the temperature difference are selected to grow the polycrystalline laminate on the substrate surface and the edge of the notch edge formation piece.

12. The system of claim 11, further comprising a computer programmed to:
after the substrate surface and the edge of the notch edge formation piece are seeded with seed droplets, lower the substrate surface and the edge of the notch edge formation piece and the notch end formation piece to the liquid surface of the reservoir;
independently control the temperature of the sample holder and the temperature of the reservoir to produce the temperature difference; and
retract the substrate surface and the edge of the notch edge formation piece and the notch end formation piece from the liquid surface of the reservoir at a draw rate selected to grow a polycrystalline ice laminate on the substrate surface and the edge of the notch edge formation piece.

13. The system of claim 12, wherein the temperature of the substrate and the notch edge formation piece is controlled by undercooling the sample holder to an initial temperature that is lower than the liquid surface temperature for an initial period of time, ramping the temperature of the substrate and the notch edge formation piece from the initial temperature to a final temperature that is lower than the initial temperature for a ramp period of time, and holding the temperature of the substrate and the notch edge formation piece at the final temperature for a final period of time.

14. The system of claim 8, further comprising:
a tensile load head having a lip configured to contact the notch of the polycrystalline laminate and driven to move the polycrystalline laminate in a direction generally perpendicular to the substrate surface and away from the substrate surface.

15. The system of claim 8, further comprising:
a shear load head having a leading end configured to contact an end of the polycrystalline laminate and driven to move the polycrystalline laminate in a direction generally parallel to the substrate length edge of the substrate surface.

16. A method of testing a polycrystalline laminate formed on a substrate surface of a substrate which is mounted to a sample holder, the substrate surface including a substrate length edge having a substrate length and a substrate width edge having a substrate width, the polycrystalline laminate having a notch extending beyond the substrate width edge of the substrate surface, the method comprising at least one of:
for tensile cleavage testing, applying a tensile load on the notch of the polycrystalline laminate in a direction generally perpendicular to the substrate surface and away from the substrate surface; and
for shear sliding testing, applying a shear load on the end of the polycrystalline laminate in a length direction generally parallel to the substrate length edge of the substrate surface.

17. The method of claim 16,
wherein applying the tensile load comprises placing a tensile load head having a lip in contact with the notch of the polycrystalline laminate and driving the tensile load head to move the notch of the polycrystalline laminate by the lip in the direction generally perpendicular to the substrate surface and away from the substrate surface; and
wherein applying the shear load comprises placing a shear load head in contact with the end of the polycrystalline laminate and driving the shear load head to move the polycrystalline laminate in the direction generally parallel to the substrate length edge of the substrate surface.

18. The method of claim 16, further comprising:
mounting the substrate, a notch edge formation piece, and a notch end formation piece to the sample holder, the edge of the notch edge formation piece disposed adjacent the substrate surface at the substrate width edge thereof, the edge of the notch edge formation piece being flush with the substrate surface and having an edge width at least equal to the substrate width and having a thickness which is substantially smaller than the substrate width of the substrate width edge, a planar surface of a notch end formation piece disposed adjacent the notch edge formation piece, the planar surface of the notch end formation piece extending in a width direction at least along the edge width of the edge of the notch edge formation piece and extending in a height direction beyond the substrate surface and the edge of the notch edge formation piece to define a location for a laminate width edge;
forming the polycrystalline laminate on the substrate surface and the edge of the notch edge formation piece, the polycrystalline laminate having the laminate width edge against the planar surface of the notch end formation piece; and removing the notch edge formation piece and the notch end formation piece from the sample holder to expose the notch of the polycrystalline laminate extending beyond the substrate width edge of the substrate surface.

19. The method of claim 18, further comprising:

mounting the substrate, the notch edge formation piece, and the notch end formation piece to the sample holder with the substrate surface and the edge of the notch edge formation piece flush with one another and facing a liquid surface of a reservoir disposed in a chamber that provides an ambient temperature;

seeding the substrate surface and the edge of the notch edge formation piece with seed droplets;

lowering the substrate surface, the edge of the notch edge formation piece, and the notch end formation piece to the liquid surface of the reservoir;

independently controlling a temperature of the substrate and the notch edge formation piece and a temperature of the reservoir to produce a temperature difference over a period of time for crystallization growth; and retracting the substrate surface and the edge of the notch edge formation piece from the liquid surface of the reservoir at a draw rate;

the draw rate and the temperature difference being selected to grow polycrystalline laminate on the substrate surface and the edge of the notch edge formation piece.

20. The method of claim 19, wherein the polycrystalline laminate is polycrystalline ice laminate and wherein the draw rate is a fixed rate selected to closely match a velocity of a freezing front of ice growth on the substrate surface and the edge of the notch edge formation piece.

\* \* \* \* \*